United States Patent
Park et al.

(10) Patent No.: US 10,556,986 B2
(45) Date of Patent: *Feb. 11, 2020

(54) POLYMER, ORGANIC LAYER COMPOSITION, AND METHOD OF FORMING PATTERNS

(71) Applicant: SAMSUNG SDI CO., LTD., Yongin-si, Gyeonggi-do (KR)

(72) Inventors: Youjung Park, Suwon-si (KR); Sunyoung Yang, Suwon-si (KR); Hyo Young Kwon, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 315 days.

This patent is subject to a terminal disclaimer.

(21) Appl. No.: 15/268,706

(22) Filed: Sep. 19, 2016

(65) Prior Publication Data

US 2017/0114181 A1    Apr. 27, 2017

(30) Foreign Application Priority Data

Oct. 23, 2015 (KR) ................. 10-2015-0148199

(51) Int. Cl.
*C08G 61/12* (2006.01)

(52) U.S. Cl.
CPC ....... *C08G 61/122* (2013.01); *C08G 2261/12* (2013.01)

(58) Field of Classification Search
CPC ............... C08G 61/122; C08G 2261/12
USPC ..................................... 430/281.1
See application file for complete search history.

(56) References Cited

U.S. PATENT DOCUMENTS

| | | | |
|---|---|---|---|
| 5,175,218 A | 12/1992 | Brugel et al. | |
| 7,349,589 B2 | 3/2008 | Temelkuran et al. | |
| 2015/0011092 A1* | 1/2015 | Someya | C08G 73/06 438/703 |

FOREIGN PATENT DOCUMENTS

| | | |
|---|---|---|
| CN | 103733136 A | 4/2014 |
| CN | 103906740 A | 7/2014 |
| CN | 104067175 A | 9/2014 |
| JP | 2007-226170 A | 9/2007 |
| JP | WO2013/047516 A1 | 4/2013 |
| KR | 10-2013-0039864 A | 4/2013 |
| KR | 10-2013-0046498 A | 5/2013 |
| KR | 10-2013-0048307 A | 5/2013 |
| KR | 10-2014-0122225 A | 10/2014 |
| KR | 10-2014-0144207 A | 12/2014 |
| KR | 10-2015-0109225 A | 10/2015 |

OTHER PUBLICATIONS

Taiwanese Notice of Allowance/Search Report dated Oct. 6, 2016 of the corresponding Taiwanese Patent Application No. 105132285.
Korean Notice of Allowance dated Mar. 2, 2018, of the corresponding Korean Patent Application No. 10-2015-0148199.
Korean Office Action dated Aug. 2, 2017 of the corresponding Korean Patent Application No. 10-2015-0148199.
Chinese Office Action and Search Report dated Sep. 5, 2018.

* cited by examiner

*Primary Examiner* — Daborah Chacko-Davis
(74) *Attorney, Agent, or Firm* — Lee & Morse, P.C.

(57) ABSTRACT

A polymer including a structural unit represented by Chemical Formula 1, and an organic layer composition including the polymer, and method of forming patterns are provided.

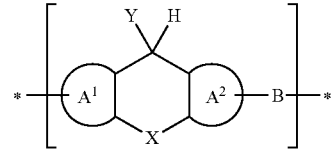

[Chemical Formula 1]

The Chemical Formula 1 is the same as defined in the detailed description.

20 Claims, 2 Drawing Sheets

[Calculation Equation 2]

Planarization $= \left(1 - \dfrac{h_2}{h_1}\right) \times 100$

POLYMER, ORGANIC LAYER COMPOSITION, AND METHOD OF FORMING PATTERNS

CROSS-REFERENCE TO RELATED APPLICATION

Korean Patent Application No. 10-2015-0148199, filed on Oct. 23, 2015, in the Korean Intellectual Property Office, and entitled: "Polymer, Organic Layer Composition, and Method of Forming Patterns," is incorporated by reference herein in its entirety.

BACKGROUND

1. Field

Embodiments relate to a polymer, an organic layer composition including the polymer, and a method of forming patterns using the organic layer composition.

2. Description of the Related Art

The semiconductor industry has developed to an ultra-fine technique having a pattern of several to several tens nanometer size. Such ultrafine technique would benefit from more effective lithographic techniques.

SUMMARY

Embodiments are directed to a polymer including a structural unit represented by Chemical Formula 1:

[Chemical Formula 1]

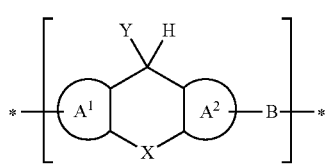

In Chemical Formula 1, $A^1$ and $A^2$ may independently be a substituted or unsubstituted aromatic ring group, or a substituted or unsubstituted heteroaromatic ring group, B may be a divalent organic group, X may be O, S, Te, Se, or $NR^a$, wherein $R^a$ is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 heterocyclic group, a substituted or unsubstituted C2 to C30 alkenyl group, a substituted or unsubstituted C2 to C30 alkynyl group, a hydroxy group, a halogen atom, a halogen-containing group, or a combination thereof, Y may be a substituted or unsubstituted C6 to C30 aryl group, or a substituted or unsubstituted C3 to C30 heteroaryl group, and * is a linking point.

Y may be a monovalent group derived from compounds of Group 1, and at least one hydrogen of the monovalent group may be substituted or unsubstituted:

[Group 1]

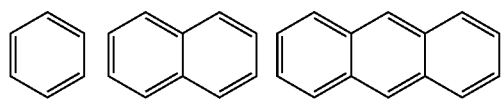

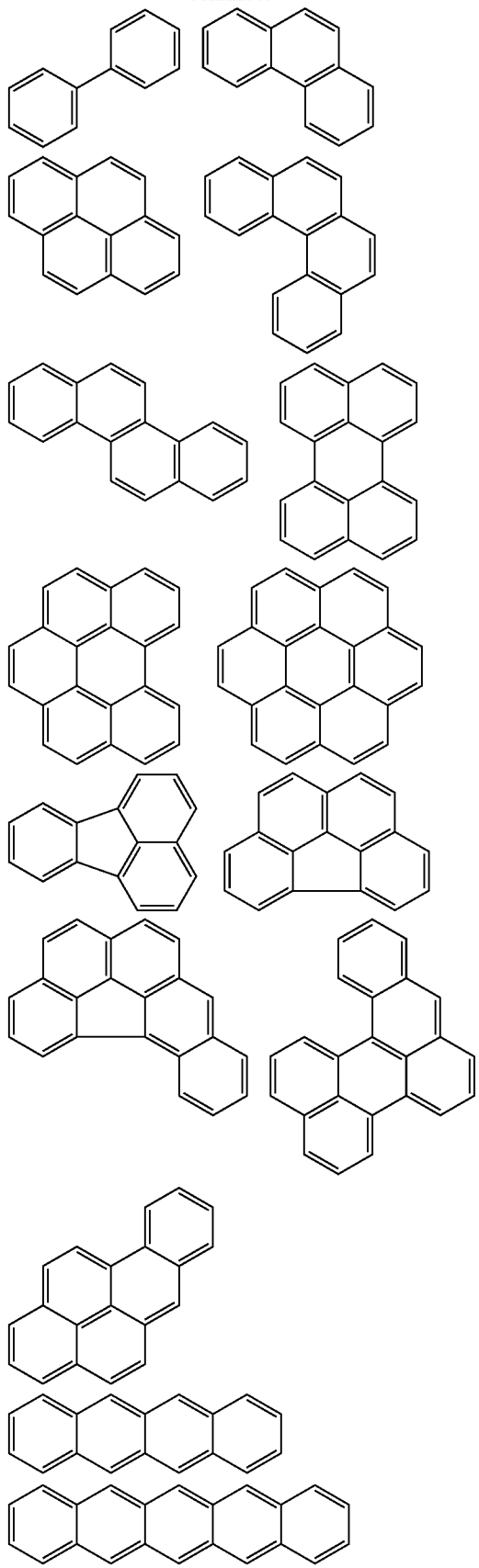

In Group 1, a linking point of each compound to Chemical Formula 1 is not limited.

The $A^1$ and $A^2$ may be a group having a structure that the $A^1$ and $A^2$ are independently a single ring or about 2 to 4 fused rings.

$A^1$ and $A^2$ may independently be a trivalent group derived from one of compounds of Group 2, and at least one hydrogen of the trivalent group is substituted or unsubstituted:

[Group 2]

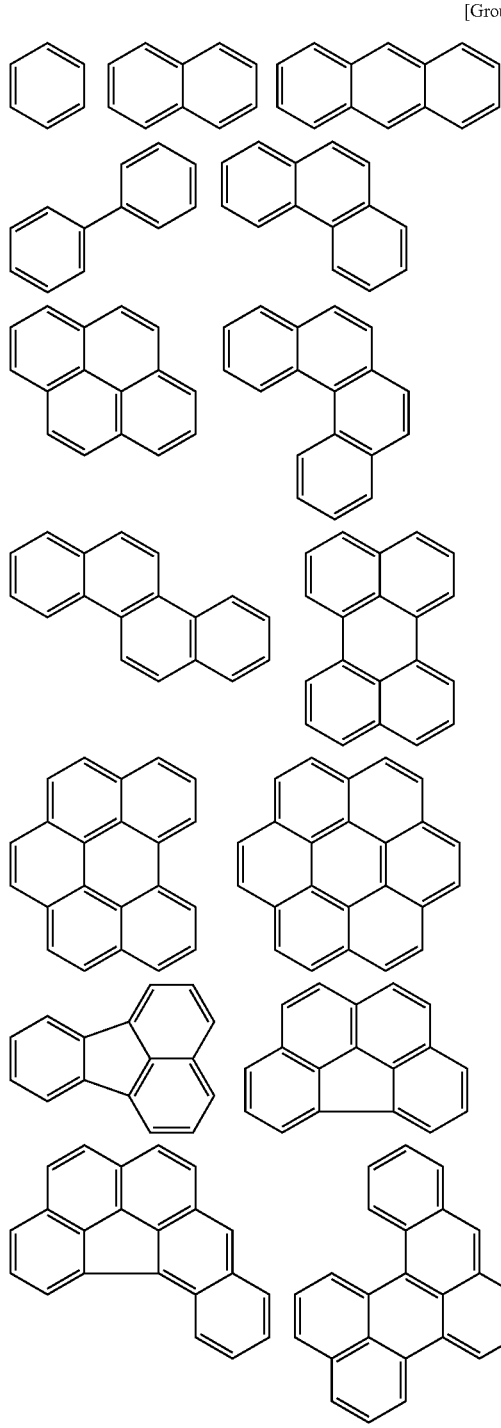

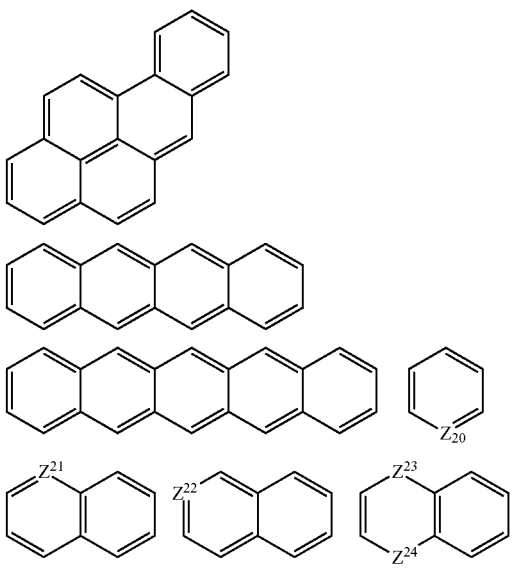

In Group 2, $Z^{20}$ to $Z^{22}$ may independently be nitrogen (N), $CR^b$, or a combination thereof, wherein $R^b$ is hydrogen, a substituted or unsubstituted C1 to C10 alkyl group, a halogen atom, a halogen-containing group, or a combination thereof, $Z^{23}$ and $Z^{24}$ may independently be C=O, O, S, $CR^cR^d$, $NR^e$, or a combination thereof, wherein $R^c$ to $R^e$ are independently hydrogen, a substituted or unsubstituted C1 to C10 alkyl group, a halogen atom, a halogen-containing group, or a combination thereof, and a linking point of each compound to Chemical Formula 1 is not limited.

B may be represented by Chemical Formula 2:

[Chemical Formula 2]

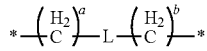

In Chemical Formula 2, a and b may independently be an integer of 0 to 2, and L may be a substituted or unsubstituted divalent group derived from one of Group 3

[Group 3]

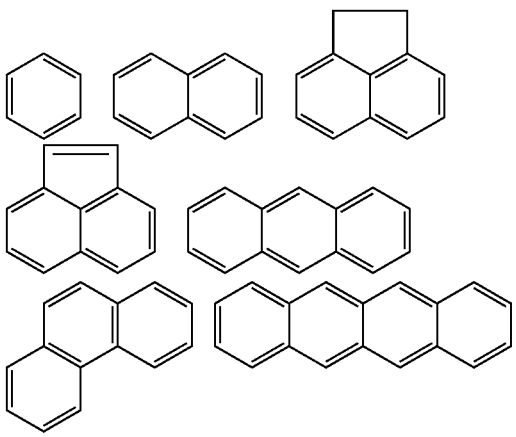

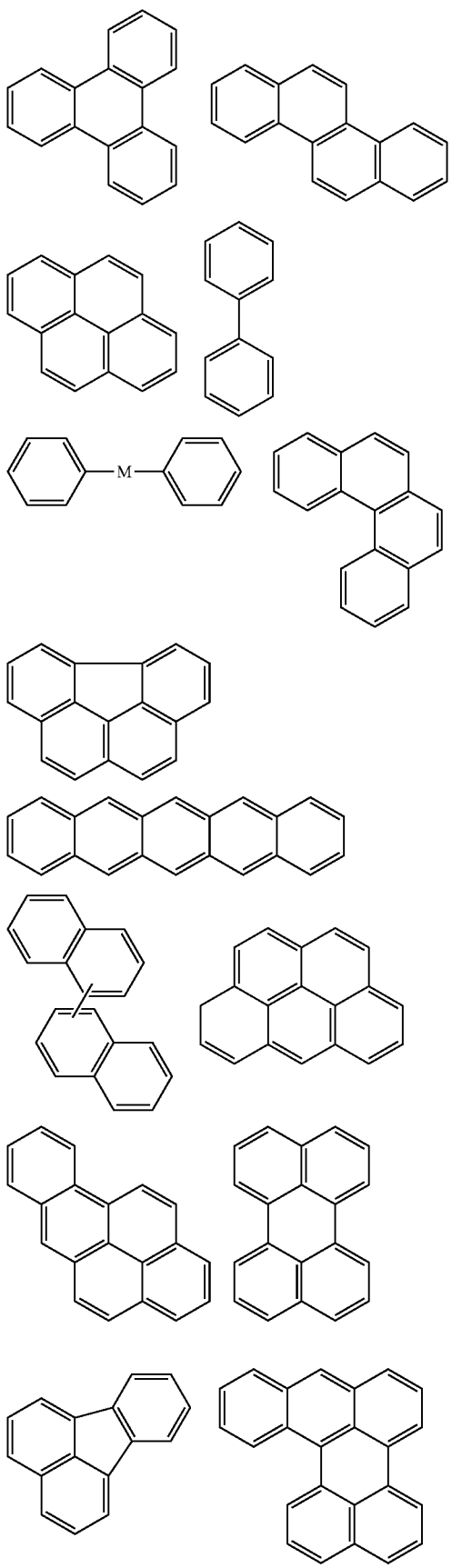

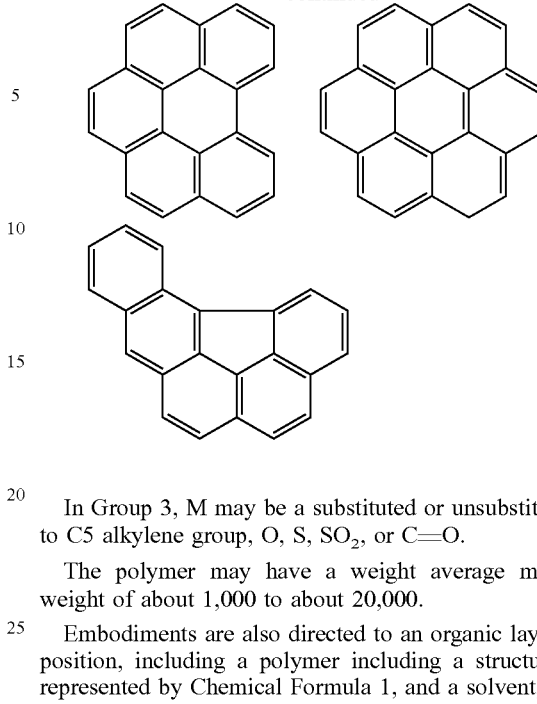

In Group 3, M may be a substituted or unsubstituted C1 to C5 alkylene group, O, S, SO$_2$, or C=O.

The polymer may have a weight average molecular weight of about 1,000 to about 20,000.

Embodiments are also directed to an organic layer composition, including a polymer including a structural unit represented by Chemical Formula 1, and a solvent,

[Chemical Formula 1]

In Chemical Formula 1, A$^1$ and A$^2$ may independently be a substituted or unsubstituted aromatic ring group, or a substituted or unsubstituted heteroaromatic ring group, B may be a divalent organic group, X may be O, S, Te, Se, or NR$^a$, wherein R$^a$ is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 heterocyclic group, a substituted or unsubstituted C2 to C30 alkenyl group, a substituted or unsubstituted C2 to C30 alkynyl group, a hydroxy group, a halogen atom, a halogen-containing group, or a combination thereof, Y may be a substituted or unsubstituted C6 to C30 aryl group, or a substituted or unsubstituted C3 to C30 heteroaryl group, and * is a linking point.

Y may be a monovalent group derived from compounds of Group 1, and at least one hydrogen of the monovalent group may be substituted or unsubstituted:

[Group 1]

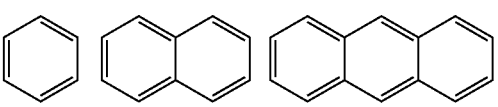

-continued

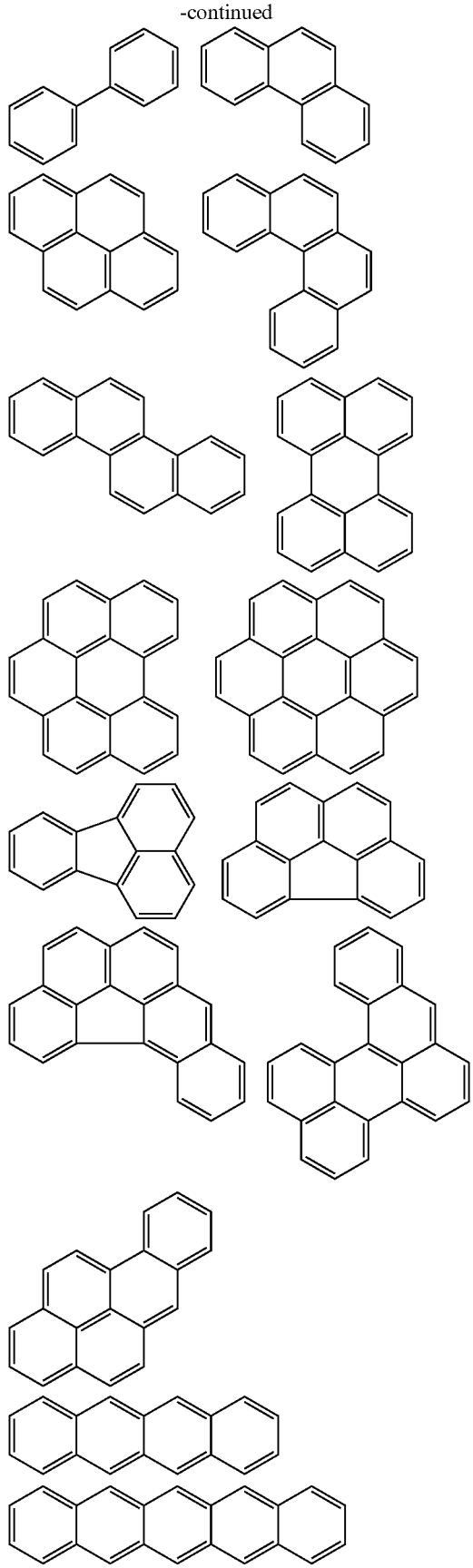

In Group 1, a linking point of each compound to Chemical Formula 1 is not limited.

The $A^1$ and $A^2$ may be a group having a structure that the $A^1$ and $A^2$ are independently a single ring or about 2 to 4 fused rings.

$A^1$ and $A^2$ may independently be a trivalent group derived from one of compounds of Group 2, and at least one hydrogen of the trivalent group may be substituted or unsubstituted:

[Group 2]

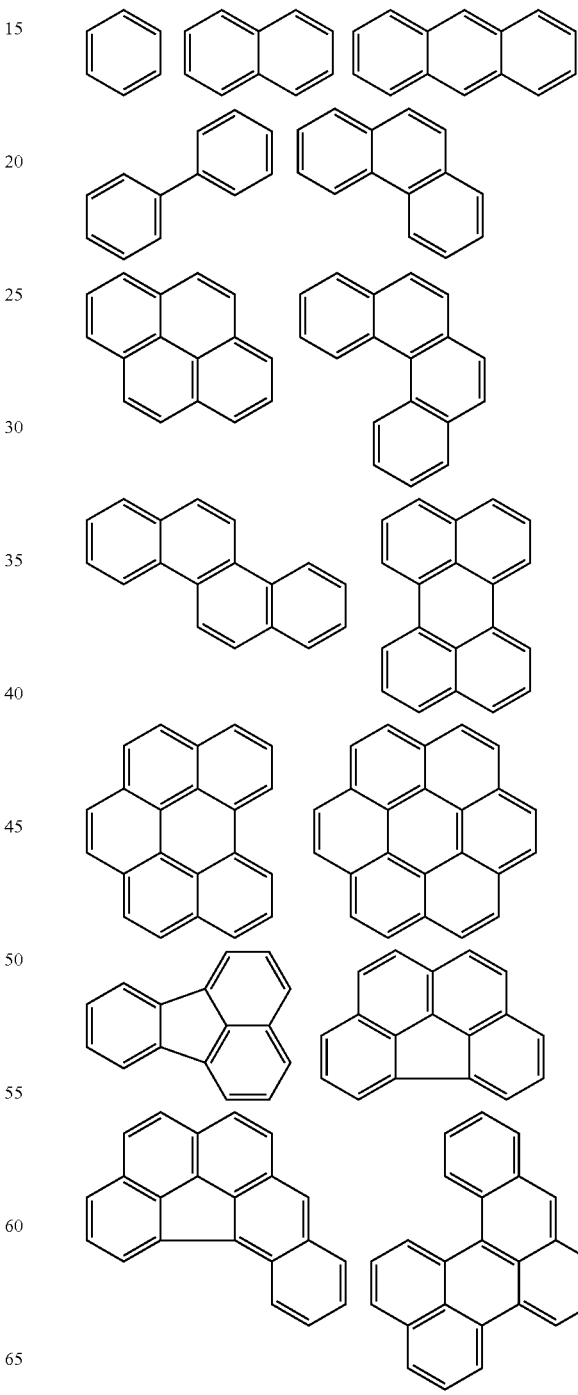

-continued

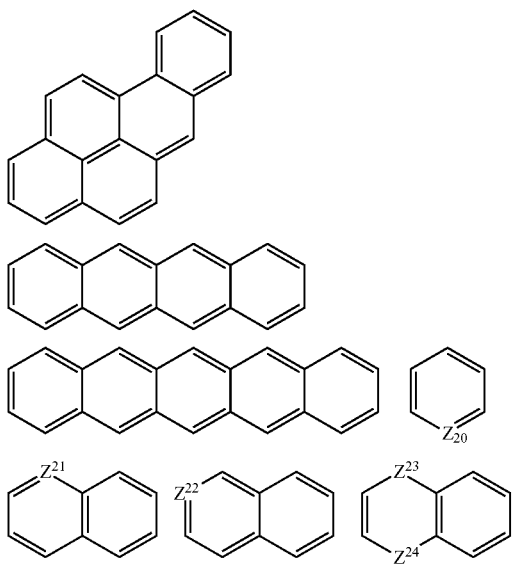

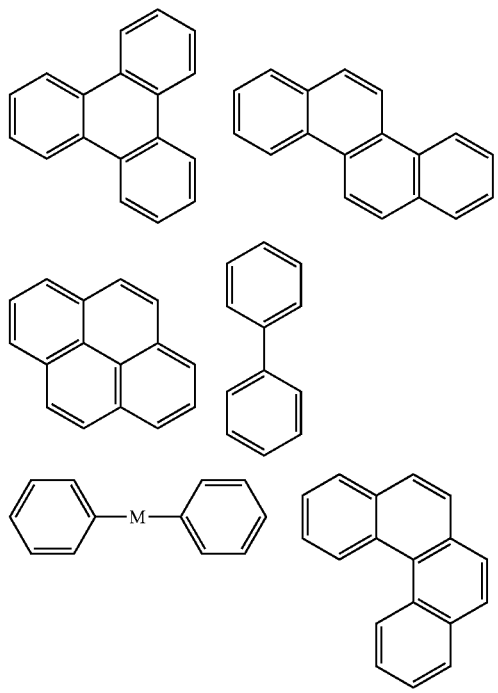

In Group 2, $Z^{20}$ to $Z^{22}$ may independently be nitrogen (N), $CR^b$, or a combination thereof, wherein $R^b$ is hydrogen, a substituted or unsubstituted C1 to C10 alkyl group, a halogen atom, a halogen-containing group, or a combination thereof, $Z^{23}$ and $Z^{24}$ may independently be C=O, O, S, $CR^cR^d$, $NR^e$, or a combination thereof, wherein $R^c$ to $R^e$ are independently hydrogen, a substituted or unsubstituted C1 to C10 alkyl group, a halogen atom, a halogen-containing group, or a combination thereof, and a linking point of each compound to Chemical Formula 1 is not limited.

B may be represented by Chemical Formula 2:

[Chemical Formula 2]

In Chemical Formula 2, a and b may independently be an integer of 0 to 2, and L may be a substituted or unsubstituted divalent group derived from one of Group 3:

[Group 3]

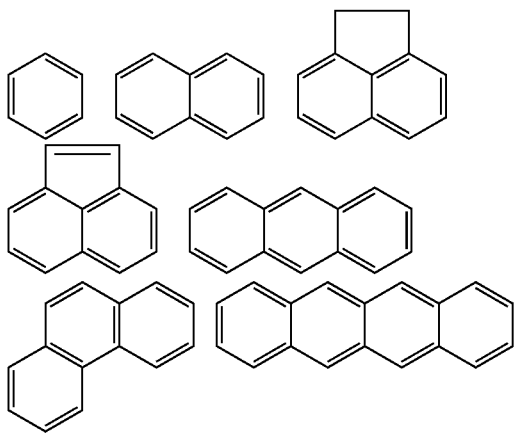

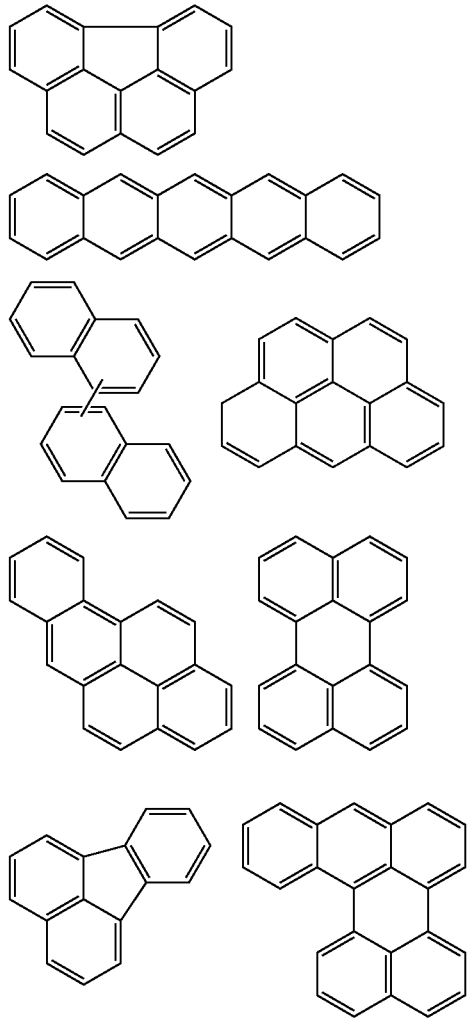

-continued

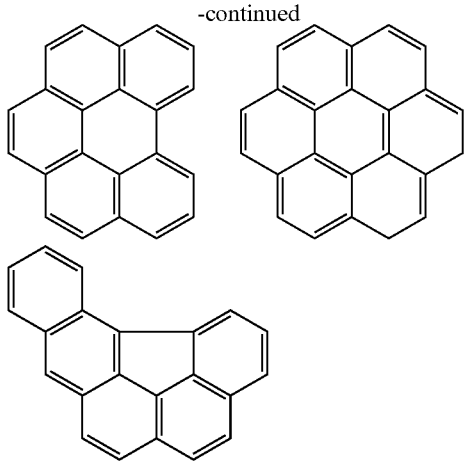

In Group 3, M may be a substituted or unsubstituted C1 to C5 alkylene group, O, S, $SO_2$, or C=O.

The polymer may have a weight average molecular weight of about 1,000 to about 20,000.

The polymer may be present in an amount of about 0.1 wt % to about 50 wt % based on the total amount of the organic layer composition.

Embodiments are also directed to a method of forming patterns, the method including providing a material layer on a substrate, applying the organic layer composition according to an embodiment on the material layer, heat-treating the organic layer composition to provide a hardmask layer, providing a silicon-containing thin layer on the hardmask layer, providing a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

The organic layer composition may be applied using a spin-on coating method.

The method may further include providing a bottom antireflective coating (BARC) before providing the photoresist layer.

Embodiments are also directed to an electronic device including the polymer according to an embodiment.

Embodiments are also directed to an electronic device including a pattern formed by the method according to an embodiment.

BRIEF DESCRIPTION OF THE DRAWINGS

Features will become apparent to those of skill in the art by describing in detail example embodiments with reference to the attached drawings in which.

DETAILED DESCRIPTION

Figure 1:
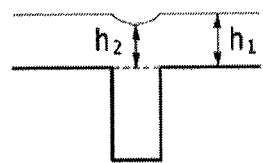
FIG. 1 illustrates a reference drawing for explaining Calculation Equation 2 to evaluate planarization characteristics.
Figure 2:
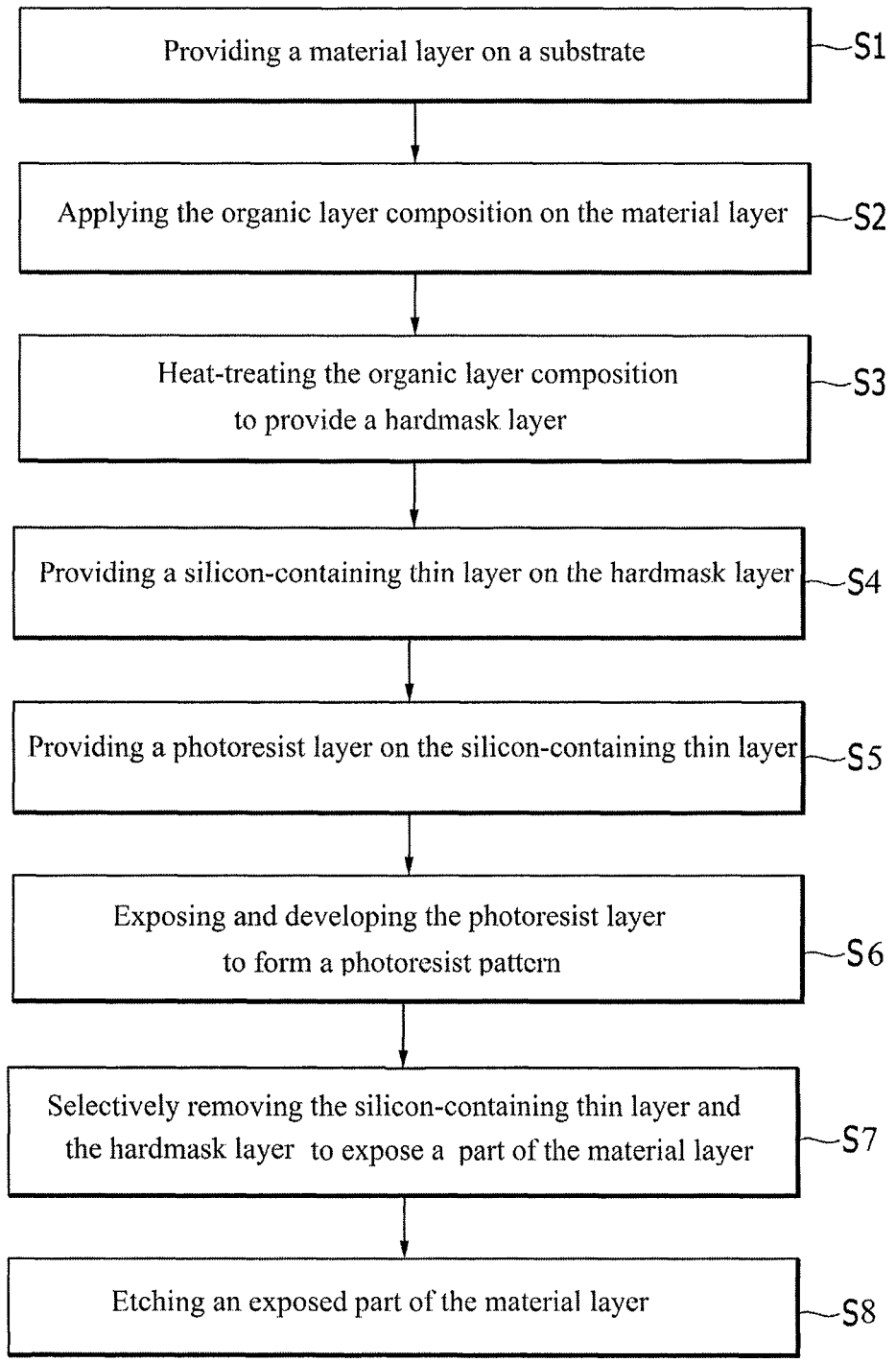
FIG. 2 illustrates a flowchart of a method of forming patterns according to one embodiment.

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey example implementations to those skilled in the art.

In the drawing figure, the dimensions of layers and regions may be exaggerated for clarity of illustration. Like reference numerals refer to like elements throughout.

As used herein, when a definition is not otherwise provided, the term 'substituted' may refer to one substituted with a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C2 to C20 heteroaryl group, a C3 to C20 heteroarylalkyl group, a C3 to C30 cycloalkyl group, a C3 to C15 cycloalkenyl group, a C6 to C15 cycloalkynyl group, a C2 to C30 heterocycloalkyl group, and a combination thereof, instead of hydrogen of a compound.

As used herein, when a definition is not otherwise provided, the term 'hetero' refers to one including 1 to 3 heteroatoms selected from N, O, S, and P.

As used herein, when a definition is not otherwise provided, indicates a linking point of a compound or a moiety of a compound.

In addition, 'a monovalent group' derived from a compound A is formed by replacing one hydrogen in the compound A. For example, a monovalent group derived from a benzene group becomes a phenyl group. In addition, a 'divalent group' derived from the compound A is a divalent group by replacing two hydrogens in the compound A and forming two linking points. For example, the divalent group derived from a benzene group becomes a phenylene group. Likewise, a 'trivalent group' derived from a compound A is a trivalent group by replacing three hydrogens in the compound A and forming three linking points.

Hereinafter, a polymer according to an example embodiment is described.

A polymer according to an example embodiment includes a structural unit represented by Chemical Formula 1.

[Chemical Formula 1]

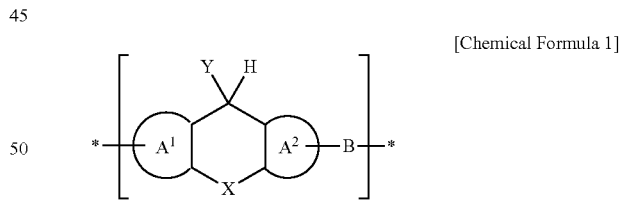

In Chemical Formula 1, $A^1$ and $A^2$ are independently a substituted or unsubstituted aromatic ring group, or a substituted or unsubstituted heteroaromatic ring group, B is a divalent organic group, X is O, S, Te, Se, or $NR^a$, wherein $R^a$ is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 heterocyclic group, a substituted or unsubstituted C2 to C30 alkenyl group, a substituted or unsubstituted C2 to C30 alkynyl group, a hydroxy group, a halogen atom, or a combination thereof, Y is a substituted or unsubstituted C6 to C30 aryl group, or a substituted or unsubstituted C3 to C30 heteroaryl group, and

* is a linking point.

In an embodiment, the structural unit represented by Chemical Formula 1 includes at least one hydroxyl group.

The structural unit represented by Chemical Formula 1 includes tertiary carbon. Herein, the 'tertiary carbon' refers to carbon where three hydrogens out of four hydrogens linked to the carbon are replaced by other groups. The polymer according to an example embodiment includes the structural unit represented by Chemical Formula 1, which includes a tertiary carbon, and thus may help prevent aromatic rings from being overlapped and piled up. Accordingly, the polymer may reduce a molecular interaction, for example, π-π stacking, and may provide excellent solubility and etch resistance.

In addition, the polymer includes a hetero atom such as nitrogen, oxygen, or sulfur in the structural unit and may have increased polarity, and may become more hydrophilic. Thus, the polymer may have improved affinity to a lower layer, for example, a silicon wafer, and further improve performance of an organic layer.

In Chemical Formula 1, the $A^1$ and $A^2$ indicating an aromatic ring group may be the same or different, A1 and $A^2$ may independently be substituted with a functional group, for example, a hydroxyl group.

In an example embodiment, the $A^1$ and $A^2$ may be a group having a structure that the $A^1$ and $A^2$ are independently a single ring or about 2 to 4 fused rings. For example, the $A^1$ and $A^2$ may independently be a trivalent group derived from one of the compounds provided in Group 2, and at least one hydrogen of the trivalent group may be substituted or unsubstituted.

[Group 2]

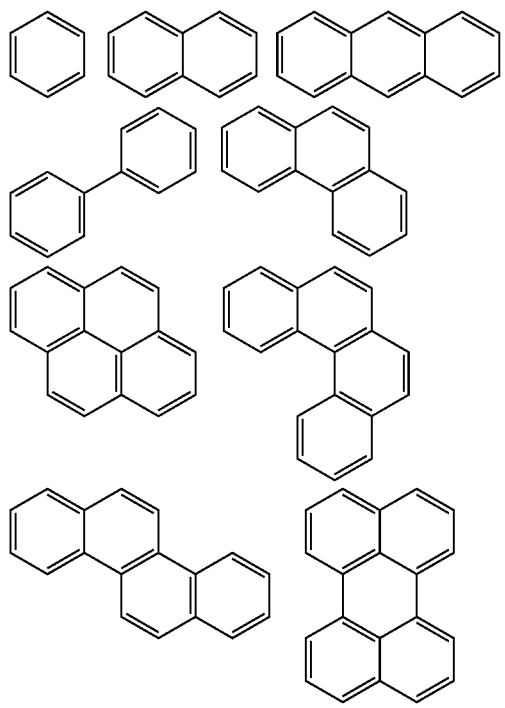
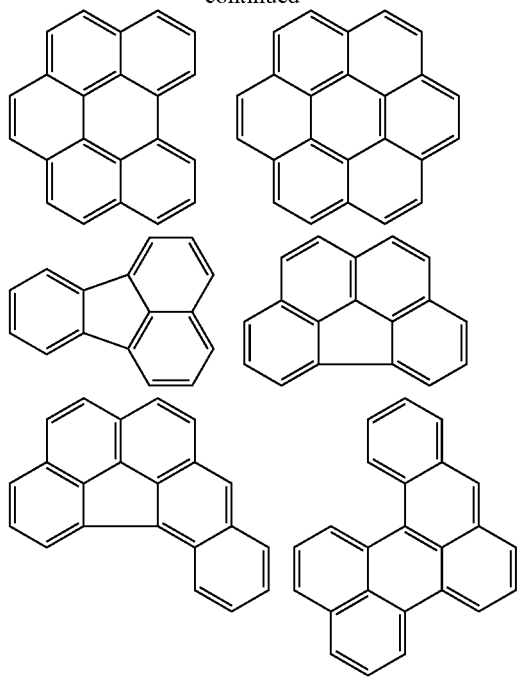
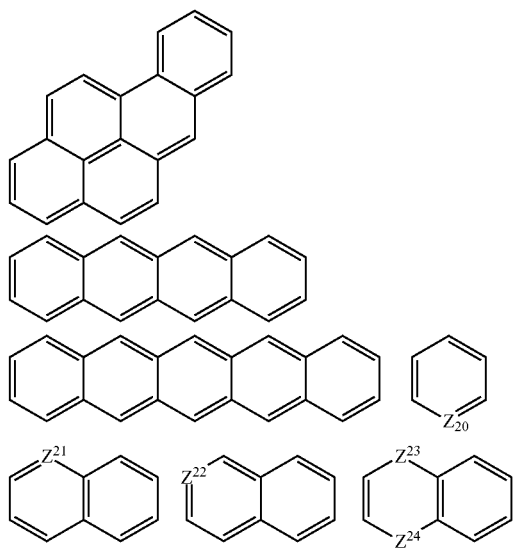

In Group 2, $Z^{20}$ to $Z^{22}$ are independently nitrogen (N), $CR^b$, or a combination thereof, wherein $R^b$ is hydrogen, a substituted or unsubstituted C1 to C10 alkyl group, a halogen atom, a halogen-containing group, or a combination thereof, $Z^{23}$ and $Z^{24}$ are independently C=O, O, S, $CR^cR^d$, $NR^e$, or a combination thereof, wherein $R^c$ to $R^e$ are independently hydrogen, a substituted or unsubstituted C1 to C10 alkyl group, a halogen atom, a halogen-containing group, or a combination thereof, Three points linked to Chemical Formula 1 of the compounds provided in Group 2 are not particularly limited.

In an example embodiment, in Chemical Formula 1, Y is a monovalent group derived from one of the compounds provided in Group 1, and at least one hydrogen of the monovalent group may be substituted or unsubstituted.

[Group 1]

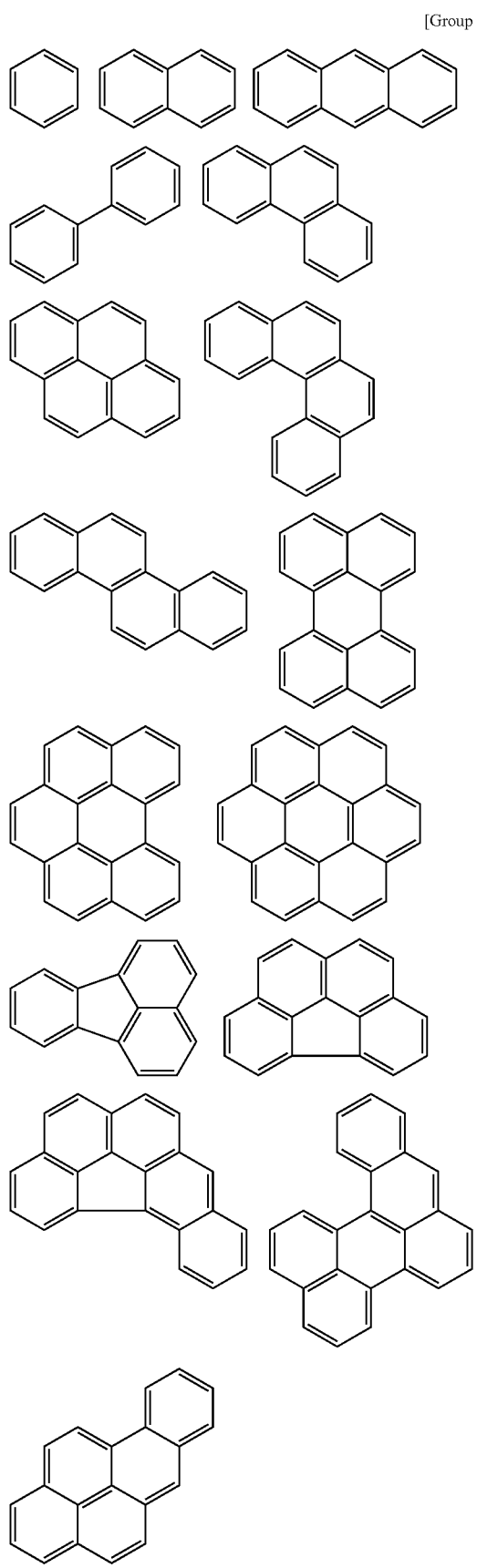

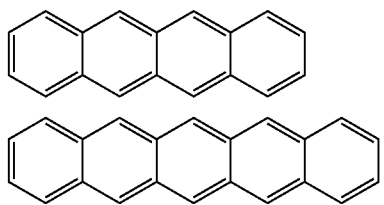

In Group 1, a linking point of each compound to Chemical Formula 1 is not particularly limited. In Group 1, each compound may be, for example, substituted with at least one hydroxy group.

B indicates a linking group in the structural unit of the polymer. In an embodiment, B may be a divalent organic group. In an embodiment, the linking group represented by B is a divalent organic group that includes at least one hydroxyl group. In an embodiment, B may be a methylene group. In an embodiment, B may contain a substituted or unsubstituted tertiary carbon in the backbone of the polymer. In an embodiment, B may be, for example represented by Chemical Formula 2.

[Chemical Formula 2]

In Chemical Formula 2, a and b are independently an integer of 0 to 2, and

L is a substituted or unsubstituted divalent group derived from one of Group 3:

[Group 3]

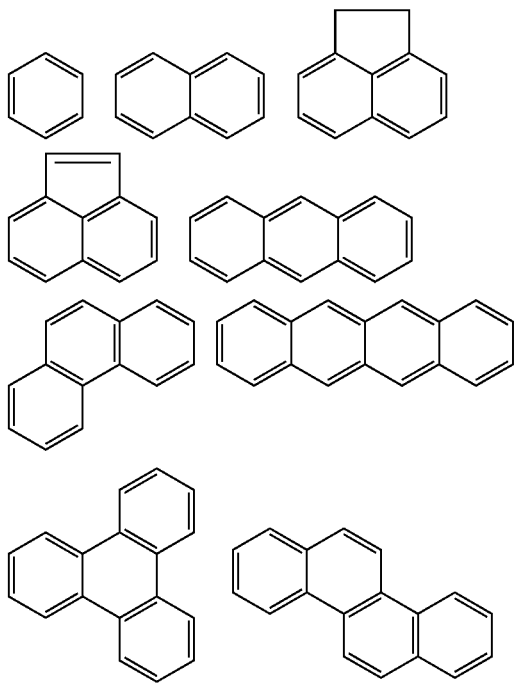

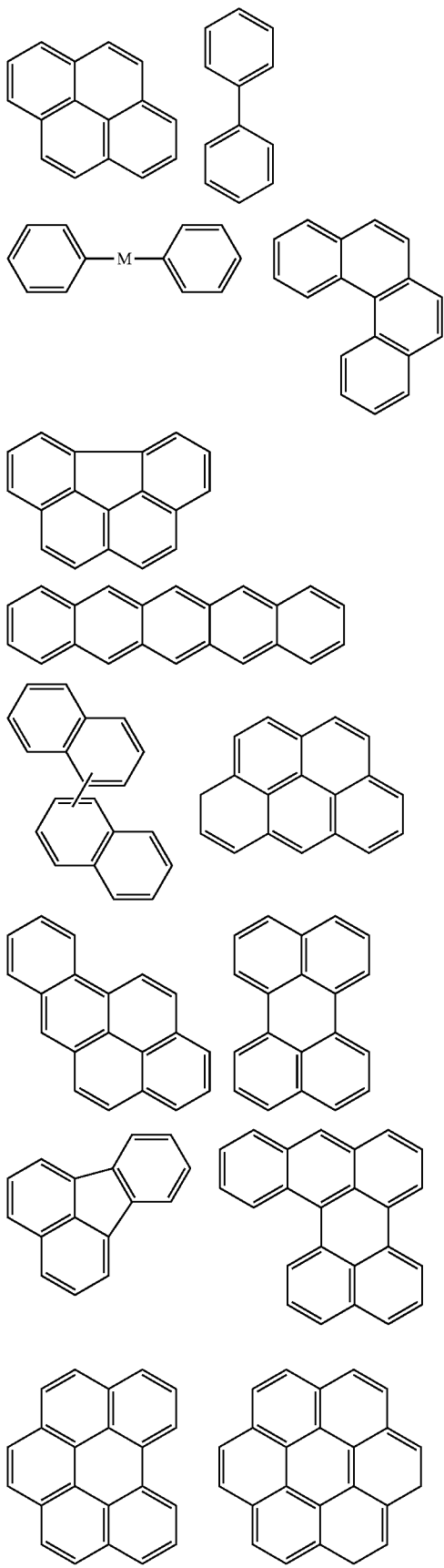

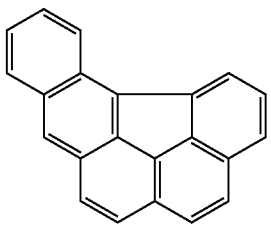

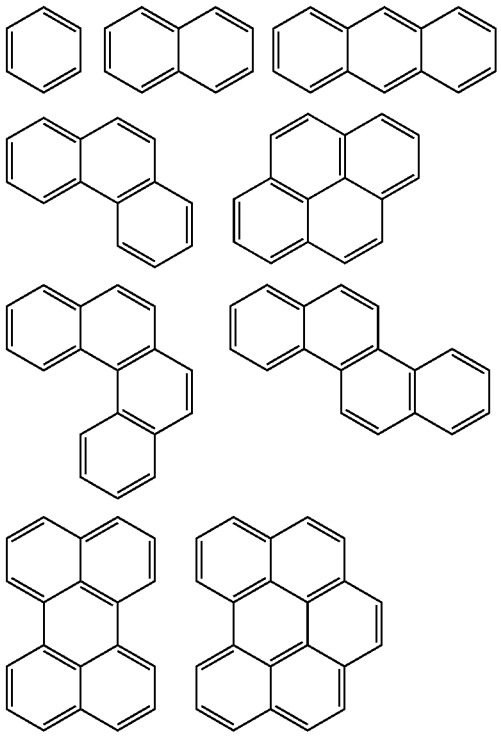

In Group 3,

M is a substituted or unsubstituted C1 to C5 alkylene group, —O—, —S—, —SO$_2$—, or C=O.

The polymer may include a plurality of structural units represented by Chemical Formula 1, and the structural units may have the same or a different structure.

The polymer may further include a structural unit represented by Chemical Formula 3.

$$*\!\!-\!\![\!\!-\!\!D\!\!-\!\!E\!\!-\!\!]\!\!-\!\!* \qquad \text{[Chemical Formula 3]}$$

In Chemical Formula 3,

D is a group including a substituted or unsubstituted aromatic ring,

E is a divalent organic group, and

* is a linking point.

For example, in Chemical Formula 3, D is a divalent group derived from compounds of Group 4, and at least one hydrogen of the divalent group may be substituted or unsubstituted.

-continued

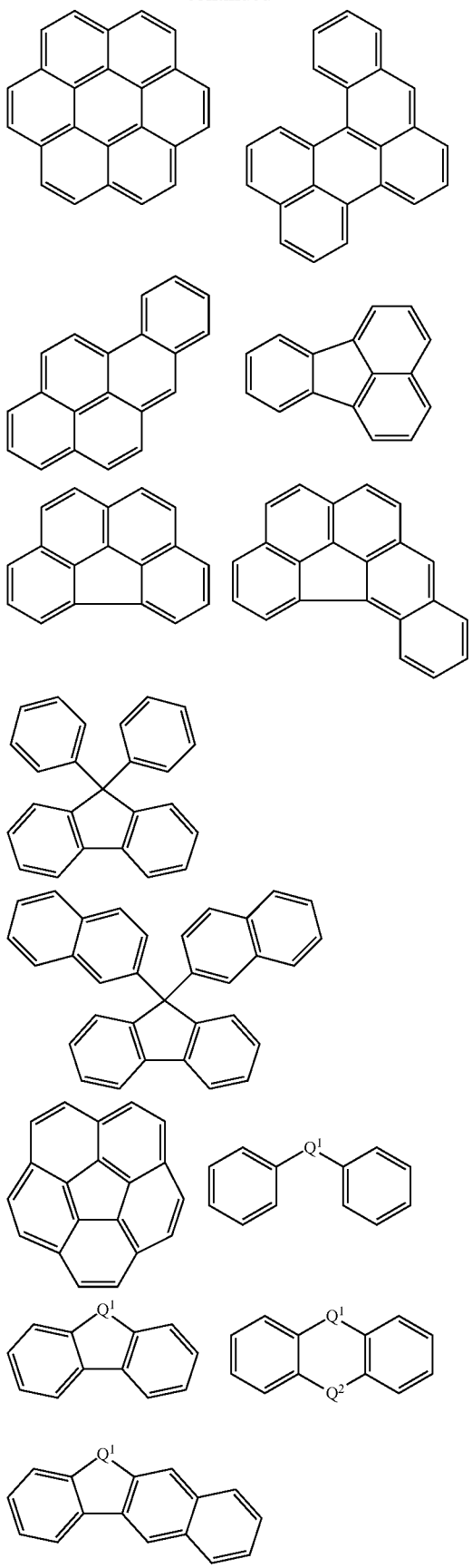

-continued

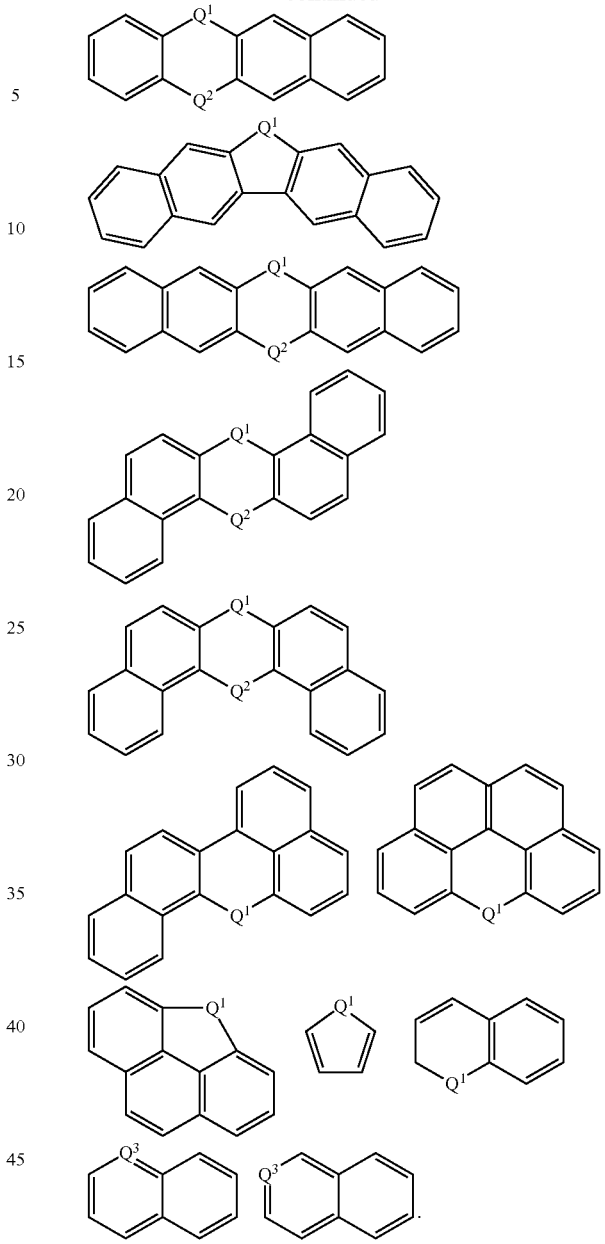

In Group 4,

Q¹ and Q² are independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, C=O, NR$^f$, oxygen (O), sulfur (S), or a combination thereof, Q³ is nitrogen (N), CRg, or a combination thereof, the R$^f$ and R$^g$ are independently hydrogen, a substituted or unsubstituted C1 to C10 alkyl group, a halogen atom, a halogen-containing group, or a combination thereof, and a linking point of Group 4 is not particularly limited.

In an example embodiment, the polymer may have a weight average molecular weight of about 1,000 to about 20,000. When the polymer has a weight average molecular weight within the range, an organic layer composition (e.g., a hardmask composition) including the polymer may be optimized by adjusting the amount of carbon and solubility in a solvent.

According to another example embodiment, an organic layer composition including the polymer and a solvent is provided.

The solvent may be a solvent having sufficient dissolubility or dispersion for the polymer, and may be or may include, for example, one or more of propylene glycol, propylene glycol diacetate, methoxypropanediol, diethylene glycol, diethylene glycol butyl ether, tri(ethylene glycol) monomethylether, propylene glycol monomethyl ether, propylene glycol monomethyl ether acetate, cyclohexanone, ethyl lactate, gamma-butyrol actone, N,N-dimethyl formamide, N,N-dimethyl acetamide, methylpyrrolidone, methylpyrrolidinone, acetylacetone, ethyl 3-ethoxypropionate, etc.

The polymer may be included in an amount of about 1 to 50 wt % based on the total amount of the organic layer composition. When the polymer is included in the range, a thickness, surface roughness, and planarization of the organic layer may be controlled.

The organic layer composition may further include an additive, for example, one or more of a surfactant, a cross-linking agent, a thermal acid generator, a plasticizer, etc.

The surfactant may be or include, for example, one or more of alkylbenzene sulfonate salt, alkyl pyridinium salt, polyethylene glycol, a quaternary ammonium salt, etc.

The cross-linking agent may be or include, for example, a melamine-based agent, a substituted urea-based agent, a polymer-based agent, etc. In an example embodiment, a cross-linking agent having at least two cross-linking forming substituents may be used, for example, a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, butoxymethylated thiourea, etc.

The cross-linking agent may be a cross-linking agent having high heat resistance. The cross-linking agent having high heat resistance may be a compound including a cross-linking substituent including an aromatic ring (for example a benzene ring or a naphthalene ring) in the molecule.

The thermal acid generator may be or include, for example, an acidic compound such as p-toluenesulfonic acid, trifluoromethanesulfonic acid, pyridiniump-toluenesulfonic acid, salicylic acid, sulfosalicylic acid, citric acid, benzoic acid, hydroxybenzoic acid, naphthalenecarbonic acid, etc., and/or 2,4,4,6-tetrabromocyclohexadienone, benzointosylate, 2-nitrobenzyltosylate, other organosulfonic acid alkylester, etc.

The additive may be present in an amount of about 0.001 to 40 parts by weight based on 100 parts by weight of the organic layer composition. When the additive is included within the range, solubility may be improved without changing optical properties of the organic layer composition.

According to another example embodiment, an organic layer manufactured using the organic layer composition is provided. The organic layer may be, for example, formed by coating the organic layer composition on a substrate and heat-treating it for curing and may include, for example, a hardmask layer, a planarization layer, a sacrificial layer, a filler, and the like for an electronic device.

Hereafter, an example method for forming patterns by using the organic layer composition is described.

A method of forming patterns according to an example embodiment includes providing a material layer on a substrate, applying the organic layer composition including the polymer and the solvent, heat-treating the organic layer composition including the monomer and the solvent to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

The substrate may be, for example, a silicon wafer, a glass substrate, or a polymer substrate.

The material layer is a material to be finally patterned, for example a metal layer such as an aluminum layer and a copper layer, a semiconductor layer such as a silicon layer, or an insulation layer such as a silicon oxide layer and a silicon nitride layer. The material layer may be formed through a method such as a chemical vapor deposition (CVD) process.

The organic layer composition is the same as described above, and may be applied by spin-on coating in a form of a solution. Herein, a thickness of the organic layer composition may be, for example about 50 Å to about 10,000 Å.

The heat-treating of the organic layer composition may be performed, for example, at about 100 to about 500° C. for about 10 seconds to about 1 hour.

The silicon-containing thin layer may be formed of, for example SiCN, SiOC, SiON, SiOCN, SiC, and/or SiN.

The method may further include forming a bottom anti-reflective coating (BARC) before forming the photoresist layer on the silicon-containing thin layer.

Exposure of the photoresist layer may be performed using, for example, ArF, KrF, or EUV. After exposure, heat treatment may be performed, for example, at about 100° C. to about 500° C.

The etching process of the exposed part of the material layer may be performed, for example, through a dry etching process using an etching gas, and the etching gas may be, for example $CHF_3$, $CF_4$, $Cl_2$, $BCl_3$, a mixed gas thereof, etc.

The etched material layer may be formed in a plurality of patterns, and the plurality of patterns may be a metal pattern, a semiconductor pattern, an insulation pattern, and the like, for example diverse patterns of a semiconductor integrated circuit device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHESIS EXAMPLES

Synthesis Example 1

5.0 g (0.013 mol) of 14-phenyl-14H-dibenzo[a,j]xanthene-2,12-diol, 2.13 g (0.013 mol) of 1,4-bis(methoxymethyl)benzene, and 15 g of propylene glycol monomethylether acetate were put in a flask, preparing a solution. Then, 0.1 g of diethyl sulfate was added to the solution, and the mixture was stirred at 100° C. for 24 hours. When a polymerization was complete, a resultant therefrom was precipitated in methanol to remove a monomer and low molecular weight components, obtaining a polymer including a structural unit represented by Chemical Formula 1a (WAMW: 2500, PDI: 2.1).

[Chemical Formula 1a]

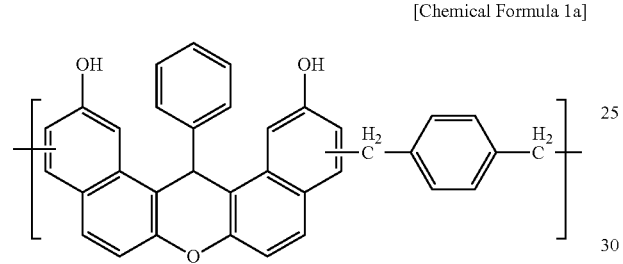

Synthesis Example 2

10.0 g (0.026 mol) of 12-(4-hydroxyphenyl)-12H-benzo[a]xanthene-3,10-diol, 1.56 g (0.052 mol) of paraformaldehyde, 5.67 g (0.026 mol) of 1-hydroxypyrene, and 35 g of propylene glycol monomethylether acetate were put in a flask, preparing a solution. Subsequently, 0.22 g (1.3 mmol) of paratoluenesulfonic acid was added thereto, and the mixture was stirred at 120° C. for 12 hours. When a polymerization was complete, a resultant therefrom was precipitated in methanol to remove a monomer and a low molecular weight, obtaining a polymer including a structural unit represented by Chemical Formula 1b (WAMW: 3800, PDI: 2.4).

Synthesis Example 3

12.4 g (0.03 mol) of 9-(pyren-1-yl)-9H-xanthene-3,6-diol, 0.9 g (0.03 mol) of paraformaldehyde, and 25 g of propylene glycol monomethylether acetate were put in a flask, preparing a solution. Subsequently, 0.2 g of diethyl sulfate was added to the solution, and the mixture was stirred at 120° C. for 20 hours. When a polymerization was complete, a resultant therefrom was precipitated in methanol to remove a monomer and a low molecular weight, obtaining a polymer including structural unit represented by Chemical Formula 1c (WAMW: 4500, PDI: 2.9).

[Chemical Formula 1c]

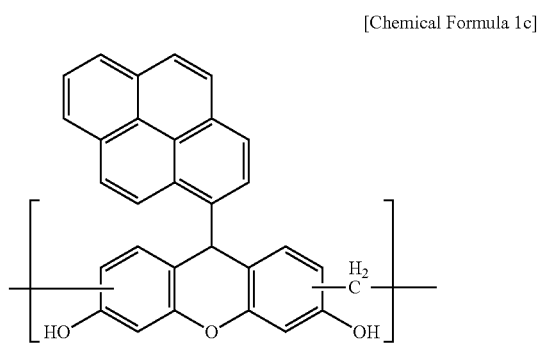

Synthesis Example 4

10.0 g (0.024 mol) of 14-(naphthalen-2-yl)-14H-dibenzo[a,j]thioxanthene, 2.93 g (0.024 mol) of 4-hydroxybenzaldehyde, and 25 g of propylene glycol monomethylether acetate were put in a flask, preparing a solution. Subsequently, 0.2 g (1.2 mmol) of paratoluenesulfonic acid was added to the solution, and the mixture was stirred at 100° C. for 24 hours. When a polymerization was complete, a resultant therefrom was precipitated in methanol to remove a monomer and a low molecular weight, obtaining a polymer including a structural unit represented by Chemical Formula 1d (WAMW: 2750, PDI: 1.9).

[Chemical Formula 1b]

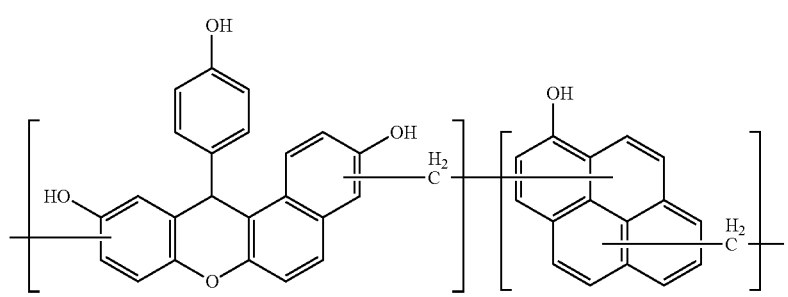

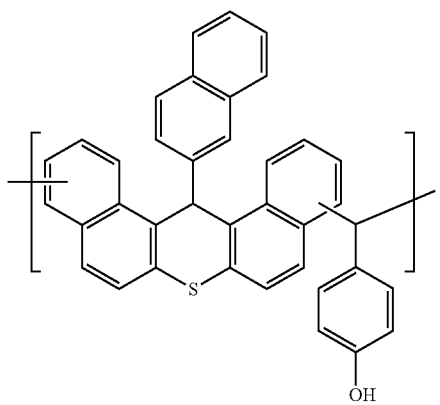

Synthesis Example 5

5.0 g (0.014 mol) of the monomer represented by Chemical Formula 1e-1 (below), 0.42 g (0.013 mol) of paraformaldehyde, and 10 g of propylene glycol monomethylether acetate were put in a flask, preparing a solution. Subsequently, 0.12 g (0.7 mmol) of paratoluene sulfonic acid was added to the solution, and the mixture was stirred at 120° C. for 50 hours. When a polymerization was complete, a resultant therefrom was precipitated in methanol to remove a monomer and a low molecular weight, obtaining a polymer including a structural unit represented by Chemical Formula 1e (WAMW: 3000, PDI: 2.4).

[Chemical Formula 1e]

[Chemical Formula 1e-1]

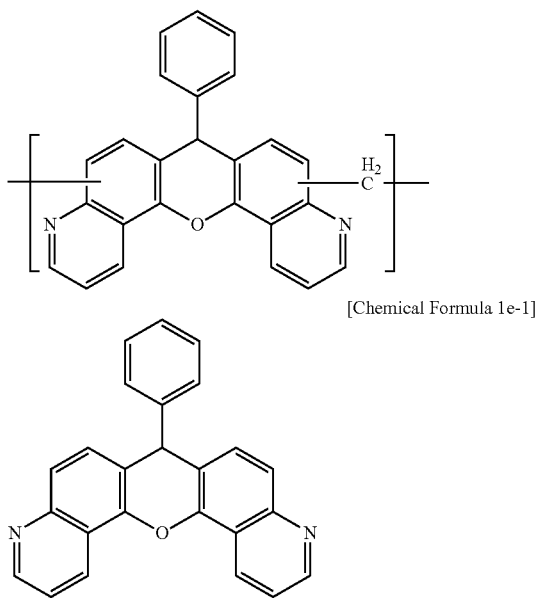

Comparative Synthesis Example 1

10.0 g (0.092 mol) of meta cresol (m-cresol), 2.76 g (0.092 mol) of paraformaldehyde, and 25 g of propylene glycol monomethylether acetate were put in a flask, preparing a solution. Subsequently, 0.12 g (0.7 mmol) of paratoluene sulfonic acid was added to the solution, and the mixture was stirred at 100° C. for 12 hours. When a polymerization was complete, a resultant therefrom was precipitated in methanol to remove a monomer and a low molecular weight, obtaining a polymer including a structural unit represented by Chemical Formula A (WAMW: 15,000, PDI: 3.8).

[Chemical Formula A]

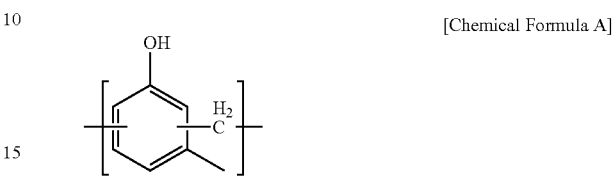

Comparative Synthesis Example 2

10.0 g (0.046 mol) of 1-hydroxypyrene, 1.38 g (0.046 mol) of paraformaldehyde, and 20 g of propylene glycol monomethylether acetate were put in a flask, preparing a solution. Subsequently, 0.17 g (1.0 mmol) of paratoluene sulfonic acid was added to the solution, and the mixture was stirred at 100° C. for 24 hours. When a polymerization was complete, a resultant therefrom was precipitated in methanol to remove monomers and low molecular weight products, obtaining a polymer including a structural unit represented by Chemical Formula B (WAMW: 3,000, PDI: 2.1).

[Chemical Formula B]

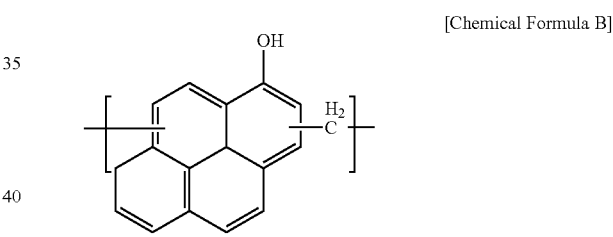

Preparation of Hardmask Composition

Example 1

The polymer according to Synthesis Example 1 was dissolved in a mixed solvent of propylene glycol monomethylether acetate (PGMEA) and cyclohexanone (7:3 (v/v)), and the solution was filtered, preparing a hardmask composition. The amount of the polymer was adjusted in a range of 3 to 15 wt % based on the total weight of the hardmask composition depending on a desired thickness.

Example 2

A hardmask composition was prepared according to the same method as Example 1 except for using the polymer according to Synthesis Example 2 instead of the polymer according to Synthesis Example 1.

Example 3

A hardmask composition was prepared according to the same method as Example 1 except for using the polymer according to Synthesis Example 3 instead of the polymer according to Synthesis Example 1.

Example 4

A hardmask composition was prepared according to the same method as Example 1 except for using the polymer according to Synthesis Example 4 instead of the polymer according to Synthesis Example 1.

Example 5

A hardmask composition was prepared according to the same method as Example 1 except for using the polymer according to Synthesis Example 5 instead of the polymer according to Synthesis Example 1.

Comparative Example 1

A hardmask composition was prepared according to the same method as Example 1 except for using the polymer according to Comparative Synthesis Example 1 instead of the polymer according to Synthesis Example 1.

Comparative Example 2

A hardmask composition was prepared according to the same method as Example 1 except for using the polymer according to Comparative Synthesis Example 2 instead of the polymer according to Synthesis Example 1.

Evaluation

Evaluation 1: Solubility Experiment

Each polymer according to Synthesis Examples 1 to 5 and Comparative Examples 1 and 2 in a concentration of 10 wt % was dissolved in propylene glycol monomethylether acetate (PGMEA) and examined with naked eyes to see if it was completely dissolved.

The results are shown in Table 1.

TABLE 1

| | Solubility examination result |
|---|---|
| Example 1 | O |
| Example 2 | O |
| Example 3 | O |
| Example 4 | O |
| Example 5 | O |
| Comparative Example 1 | X |
| Comparative Example 2 | X |

In Table 1, "O" indicates satisfactory solubility (when a solid not dissolved but remaining was not observed with naked eyes), and "X" indicates insufficient solubility (when a solid not dissolved but remaining there was observed with naked eyes).

Referring to Table 1, the polymers according to Synthesis Examples 1 to 5 exhibited improved solubility compared with the polymers according to Comparative Examples 1 to 2.

Evaluation 2: Etch Resistance

The hardmask compositions according to Example 1 to 5 and Comparative Example 1 (a polymer content: 10 wt %) were respectively coated on a silicon wafer and subsequently baked at 200° C. for 2 minutes, forming each thin film. The thickness of the thin film was measured by using a thin film thickness-measuring equipment made by K-MAC.

Subsequently, the thin film was dry-etched by using CFx mixed gas (mixed gas of $CHF_3/CF_4$) for 100 seconds, the thickness of the thin film was measured, and its bulk etch rate (BER) was calculated according to Calculation Equation 1.

Bulk etch rate (BER)=(Initial thickness of thin film−Thickness of thin film after etching)/Etching time (Å/s)     [Calculation Equation 1]

The results are shown in Table 2.

TABLE 2

| | Bulk etch rate (Å/sec) $CHF_3/CF_4$ mixed gas |
|---|---|
| Example 1 | 31 |
| Example 2 | 29 |
| Example 3 | 28 |
| Example 4 | 29 |
| Example 5 | 30 |
| Comparative Example 1 | 34 |

Referring to Table 2, each thin film respectively formed of the hardmask compositions according to Examples 1 to 5 exhibited sufficient etch resistance about etching gas and thus improved bulk etch characteristics compared with each thin film respectively formed of the hardmask compositions according to Comparative Example 1.

Evaluation 3: Contact Angle Experiment

The hardmask compositions (a polymer content: 10 wt %) according to Examples 1 to 5 and Comparative Example 2 were respectively coated on a silicon wafer and subsequently baked at 200° C. for 2 minutes, forming each thin film. Subsequently, the contact angle of the hardmask thin film was measured by using a contact angle-measuring device, DSA 100 (KRUSS GmbH).

The results are shown in Table 3.

TABLE 3

| | Contact angle (°) |
|---|---|
| Example 1 | 39 |
| Example 2 | 40 |
| Example 3 | 39 |
| Example 4 | 37 |
| Example 5 | 38 |
| Comparative Example 2 | 42 |

Referring to Table 3, each thin film respectively formed of the hardmask compositions according to Examples 1 to 5 had a small contact angle and thus excellent affinity to the silicon wafer compared with each thin film respectively formed of the hardmask compositions according to Comparative Example 2.

Evaluation 4: Planarization Characteristics and Gap-Fill Characteristics

The hardmask compositions (a solid content: 5 wt %) according to Examples 1 to 5 and Comparative Examples 1 and 2 were respectively spin-on coated on a patterned silicon wafer and heat-treated at 400° C. for 2 minutes, forming each thin film.

First, the thickness of the hardmask layer was measured from the image of the cross section of the pattern observed with a SEM and calculated according to Calculation Equation 2 provided in FIG. 1. Referring to Equation 2, in general, planarization characteristics are better as a difference between h1 and h2 is smaller.

Gap-fill characteristics were evaluated by examining whether a void was generated or not by examining the cross section of a pattern with an electron scanning microscope (SEM). When there was no void, the gap-fill characteristics were good, while, when there was a void, the gap-fill characteristics were poor.

The results are shown in Table 4.

TABLE 4

| | Step (nm) | Gap-fill characteristics |
|---|---|---|
| Example 1 | 29.7 | Good |
| Example 2 | 30.1 | Good |
| Example 3 | 42.5 | Good |
| Example 4 | 38.7 | Good |
| Example 5 | 25.6 | Good |
| Comparative Example 1 | 56.9 | Void |
| Comparative Example 2 | 72.8 | Void |

Referring to Table 4, each thin film respectively formed of the hardmask compositions according to Examples 1 to 5 exhibited excellent planarization characteristics and gap-fill performance compared with each thin film respectively formed of the hardmask compositions according to Comparative Examples 1 and 2.

By way of summation and review, a lithographic technique may include providing a material layer on a semiconductor substrate; coating a photoresist layer thereon; exposing and developing the same to provide a photoresist pattern; and etching the material layer using the photoresist pattern as a mask. When reducing the size of a pattern to be formed, it may be difficult to provide a fine pattern having an excellent profile by only above-mentioned typical lithographic technique. Accordingly, a layer, called a hardmask layer, may be formed between the material layer and the photoresist layer to help provide a fine pattern. The hardmask layer may play a role of an intermediate layer for transferring the fine pattern of photoresist to the material layer through a selective etching process. The hardmask layer is desired to have characteristics such as heat resistance, etch resistance, and the like, to be tolerated during multiple etching processes. Consideration has been given to forming a hardmask layer by a spin-on coating method instead of, for example, chemical vapor deposition. The spin-on coating method is easy to perform and may also improve gap-fill characteristics and planarization characteristics. Herein, the gap-fill characteristics (filling patterns without a void) help realize the fine pattern by forming multi patterns. In addition, the surface of the hardmask layer may be planarized by an underlayer, when a substrate has a step, or when a pattern-close region and no-pattern region are present together on a wafer. Development of an organic layer material satisfying the characteristics for a hardmask layer is desired.

As described above, embodiments may provide a polymer having improved solubility while ensuring etch resistance. Embodiments may provide an organic layer composition having mechanical characteristics and film coating properties. Embodiments may provide a method of forming patterns using the organic layer composition.

Embodiments may provide a polymer having improved solubility that secures etch resistance and thus may have excellent coating during a solution process, as well as increased hydrophilicity and improved affinity to a lower layer. When the polymer is used to form an organic layer, the layer may simultaneously have desirable mechanical characteristics and planarization characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A polymer comprising a structural unit represented by Chemical Formula 1:

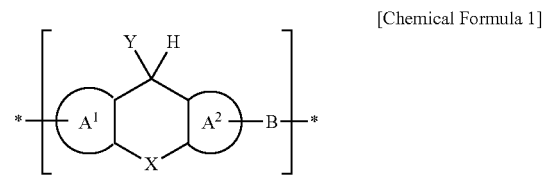

[Chemical Formula 1]

wherein, in Chemical Formula 1,
$A^1$ and $A^2$ are independently a substituted or unsubstituted aromatic ring group, or a substituted or unsubstituted heteroaromatic ring group,
B is a divalent organic group,
X is O, S, Te, Se, or $NR^a$, wherein $R^a$ is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 heterocyclic group, a substituted or unsubstituted C2 to C30 alkenyl group, a substituted or unsubstituted C2 to C30 alkynyl group, a hydroxy group, a halogen atom, a halogen-containing group, or a combination thereof,
Y is a substituted or unsubstituted C6 to C30 aryl group, or a substituted or unsubstituted C3 to C30 heteroaryl group, and
* is a linking point.

2. The polymer as claimed in claim 1, wherein Y is a substituted or unsubstituted monovalent group derived from compounds of Group 1:

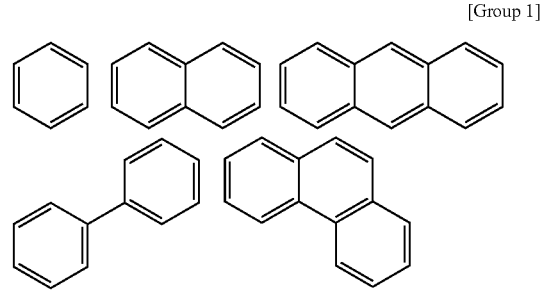

[Group 1]

-continued

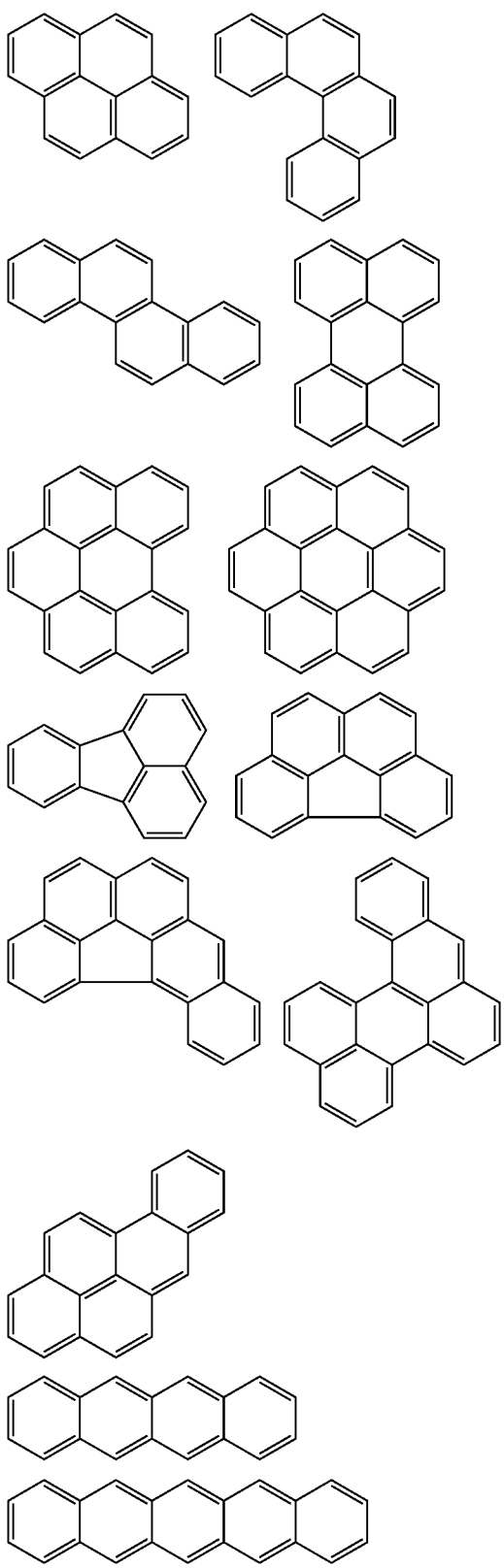

wherein, in Group 1,
a linking point of each compound to Chemical Formula 1 is not limited.

3. The polymer as claimed in claim 1, wherein the $A^1$ and $A^2$ are a group having a structure that the $A^1$ and $A^2$ are independently a single ring or about 2 to 4 fused rings.

4. The polymer as claimed in claim 1, wherein $A^1$ and $A^2$ are independently a substituted or unsubstituted trivalent group derived from one of compounds of Group 2:

[Group 2]

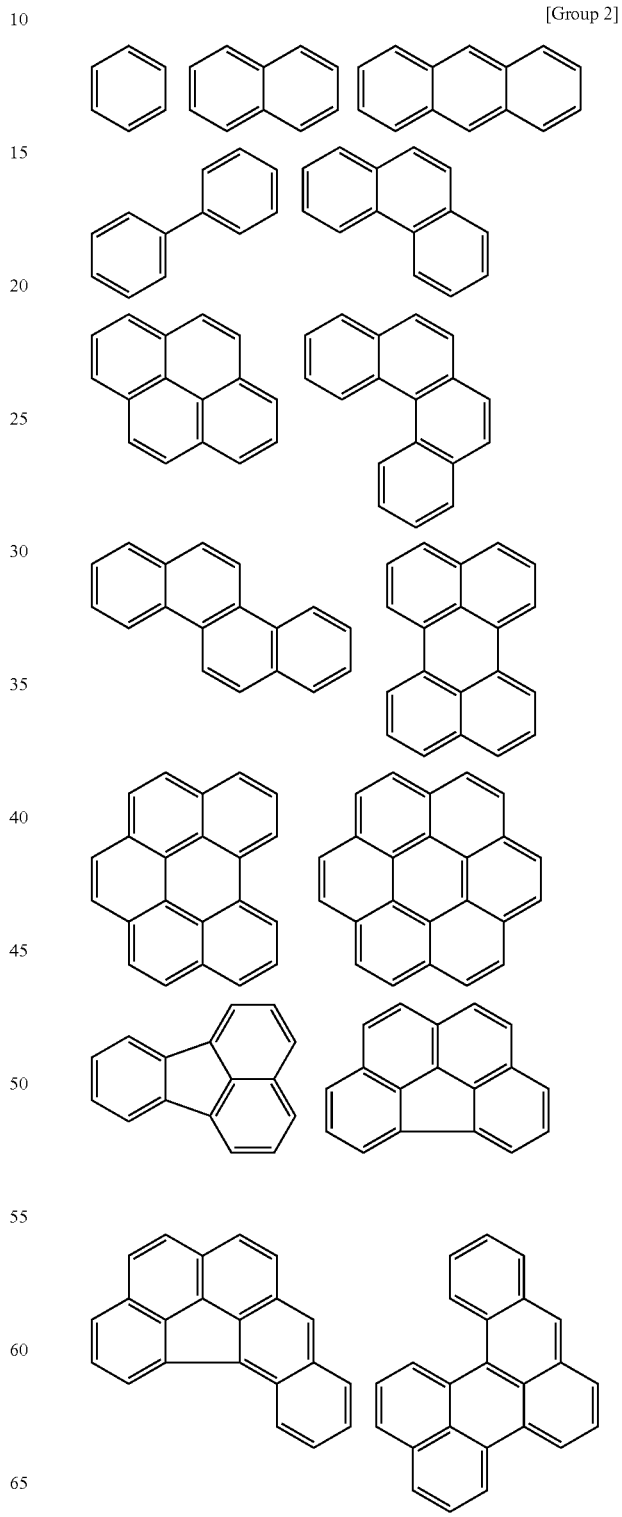

-continued

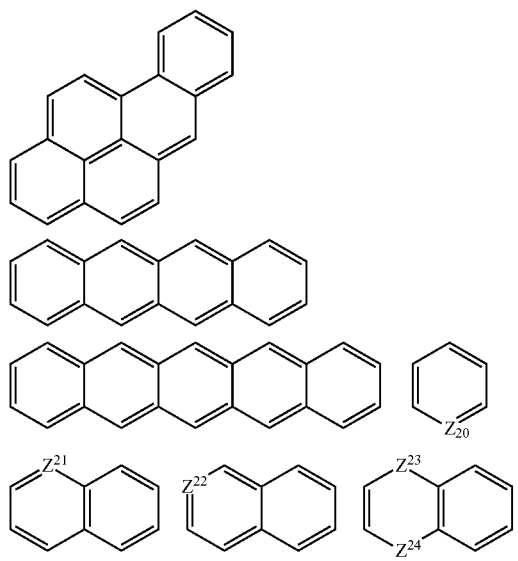

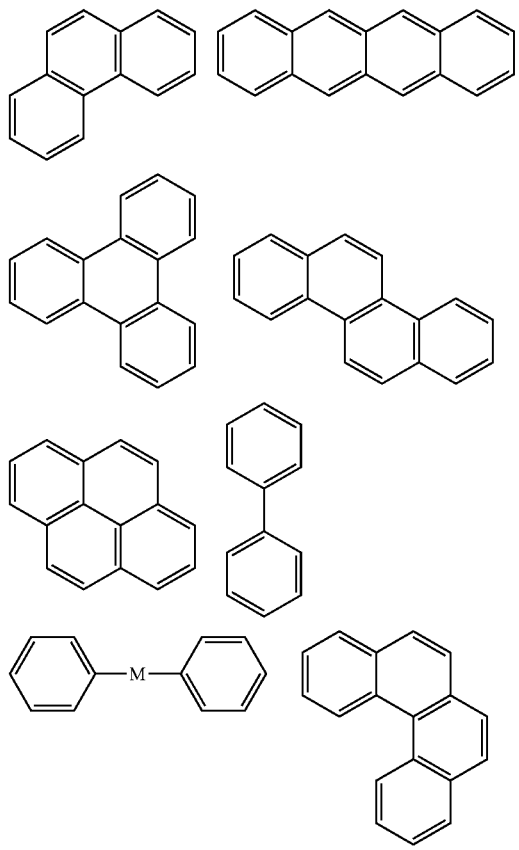

wherein, in Group 2, $Z^{20}$ to $Z^{22}$ are independently nitrogen (N), $CR^b$, or a combination thereof, wherein $R^b$ is hydrogen, a substituted or unsubstituted C1 to C10 alkyl group, a halogen atom, a halogen-containing group, or a combination thereof, $Z^{23}$ and $Z^{24}$ are independently C=O, O, S, $CR^cR^d$, $NR^e$, or a combination thereof, wherein $R^c$ to $R^e$ are independently hydrogen, a substituted or unsubstituted C1 to C10 alkyl group, a halogen atom, a halogen-containing group, or a combination thereof, and a linking point of each compound to Chemical Formula 1 is not limited.

5. The polymer as claimed in claim 1, wherein B is represented by Chemical Formula 2:

[Chemical Formula 2]

wherein, in Chemical Formula 2, a and b are independently an integer of 0 to 2, and L is a substituted or unsubstituted divalent group derived from one of Group 3:

[Group 3]

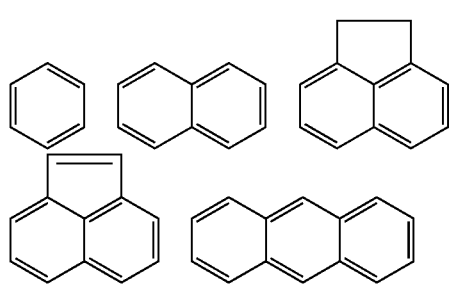

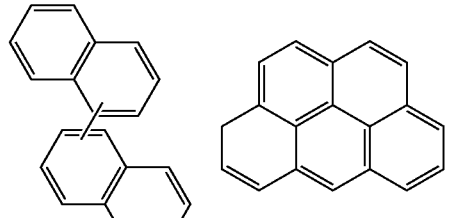

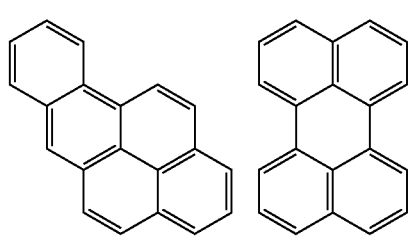

-continued

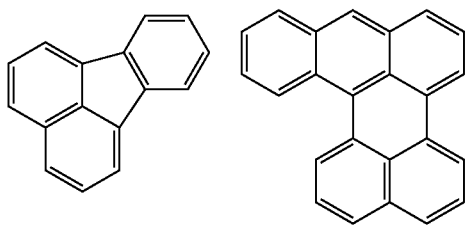 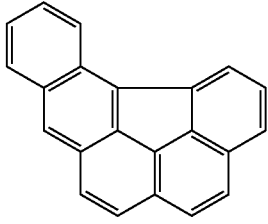

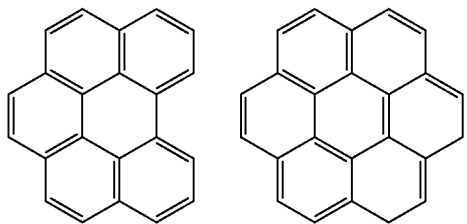

wherein, in Group 3,
M is a substituted or unsubstituted C1 to C5 alkylene group, O, S, SO$_2$, or C=O.

6. The polymer as claimed in claim 1, wherein the polymer has a weight average molecular weight of about 1,000 to about 20,000.

7. The polymer as claimed in claim 1, wherein X is O, S, Te, or Se.

8. The polymer as claimed in claim 1, wherein the polymer comprising a structural unit represented by Chemical Formula 1 includes a structural unit represented by one of the following Chemical Formulae 1a to 1e:

<Chemical Formula 1a>

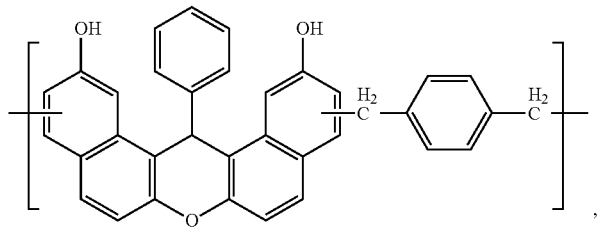

<Chemical Formula 1b>

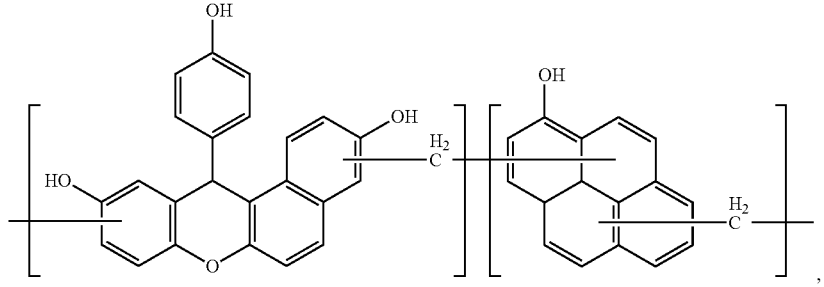

<Chemical Formula 1c>

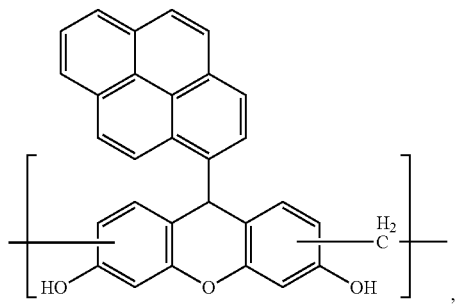

<Chemical Formula 1d>

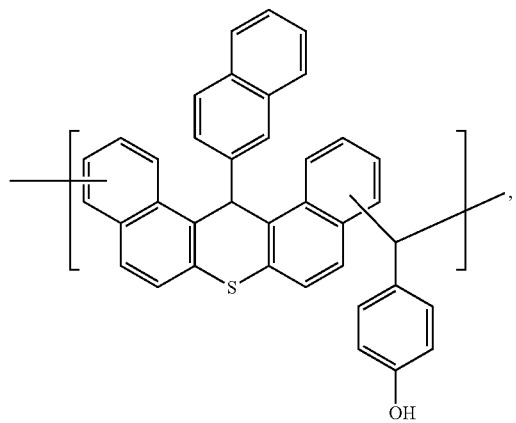

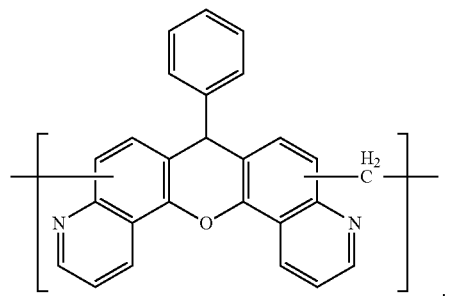

9. An organic layer composition, comprising:
a polymer including a structural unit represented by Chemical Formula 1, and
a solvent,

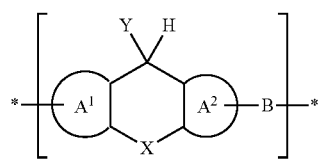
[Chemical Formula 1]

wherein, in Chemical Formula 1, $A^1$ and $A^2$ are independently a substituted or unsubstituted aromatic ring group, or a substituted or unsubstituted heteroaromatic ring group, B is a divalent organic group, X is O, S, Te, Se, or $NR^a$, wherein $R^a$ is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 aryl-alkyl group, a substituted or unsubstituted C1 to C30 heteroalkyl group, a substituted or unsubstituted C2 to C30 heterocycloalkyl group, a substituted or unsubstituted C2 to C30 heterocyclic group, a substituted or unsubstituted C2 to C30 alkenyl group, a substituted or unsubstituted C2 to C30 alkynyl group, a hydroxy group, a halogen atom, a halogen-containing group, or a combination thereof, Y is a substituted or unsubstituted C6 to C30 aryl group, or a substituted or unsubstituted C3 to C30 heteroaryl group, and

* is a linking point.

10. The organic layer composition as claimed in claim 9, wherein Y is a substituted or unsubstituted monovalent group derived from compounds of Group 1

[Group 1]

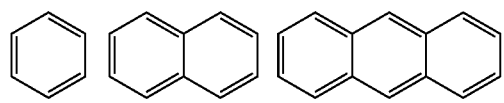

<Chemical Formula 1e>

-continued

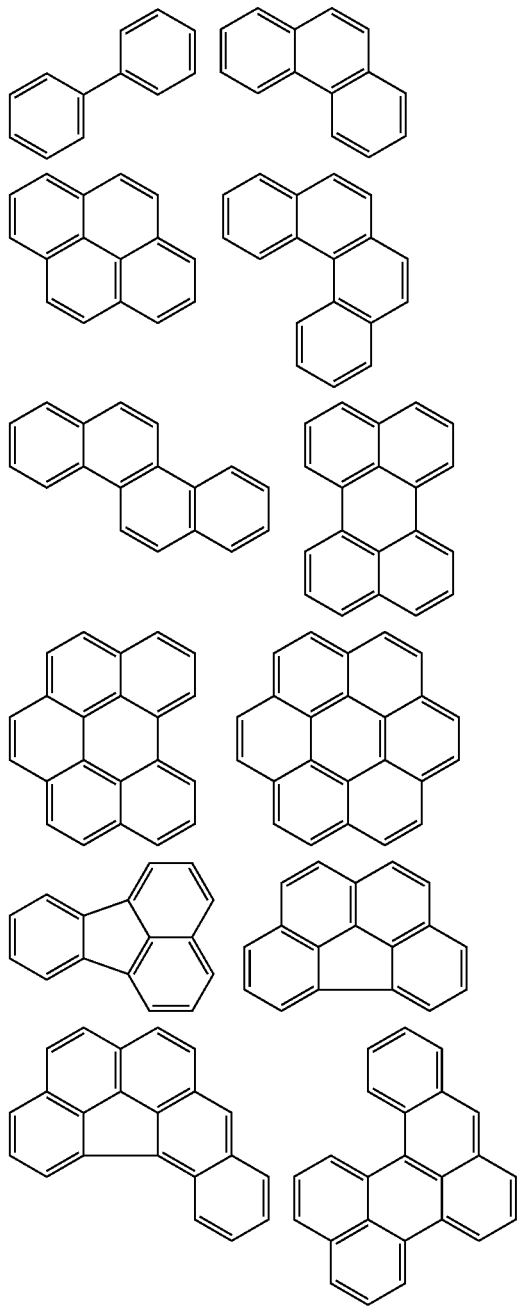

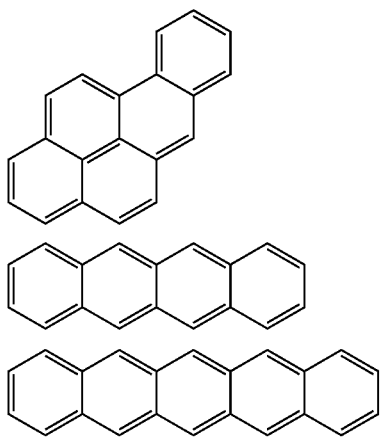

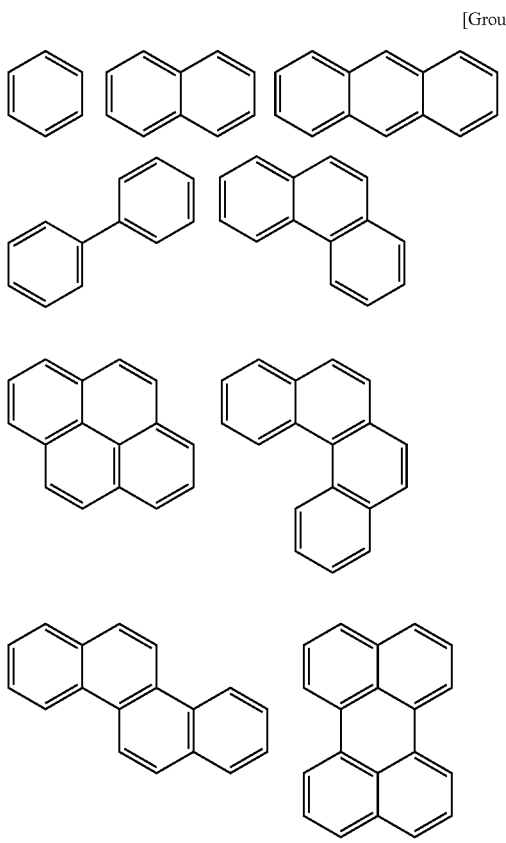

wherein, in Group 1, a linking point of each compound to Chemical Formula 1 is not limited.

11. The organic layer composition as claimed in claim 9, wherein the $A^1$ and $A^2$ are a group having a structure that the $A^1$ and $A^2$ are independently a single ring or about 2 to 4 fused rings.

12. The organic layer composition as claimed in claim 9, wherein $A^1$ and $A^2$ are independently a substituted or unsubstituted trivalent group derived from one of compounds of Group 2:

[Group 2]

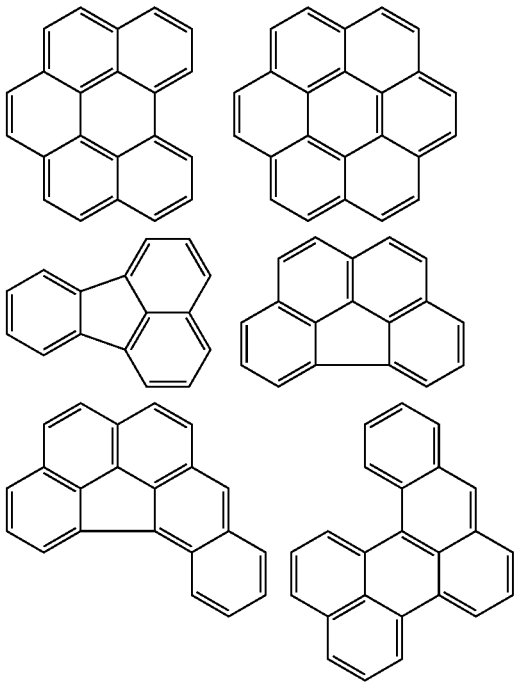

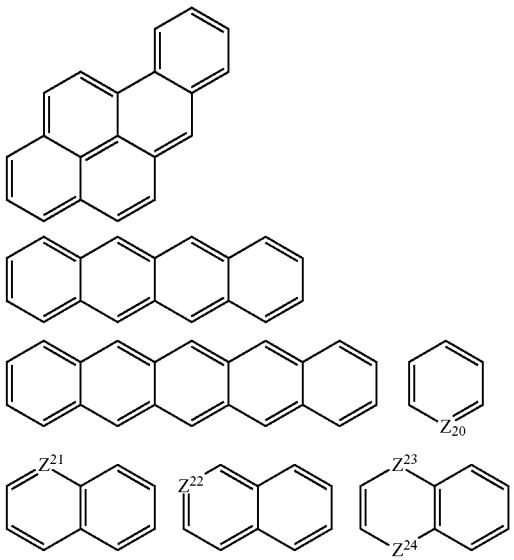

wherein, in Group 2, $Z^{20}$ to $Z^{22}$ are independently nitrogen (N), $CR^b$, or a combination thereof, wherein $R^b$ is hydrogen, a substituted or unsubstituted C1 to C10 alkyl group, a halogen atom, a halogen-containing group, or a combination thereof, $Z^{23}$ and $Z^{24}$ are independently C=O, O, S, $CR^cR^d$, $NR^e$, or a combination thereof, wherein $R^c$ to $R^e$ are independently hydrogen, a substituted or unsubstituted C1 to C10 alkyl group, a halogen atom, a halogen-containing group, or a combination thereof, and a linking point of each compound to Chemical Formula 1 is not limited.

13. The organic layer composition as claimed in claim 9, wherein B is represented by Chemical Formula 2:

[Chemical Formula 2]

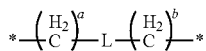

wherein, in Chemical Formula 2, a and b are independently an integer of 0 to 2, and L is a substituted or unsubstituted divalent group derived from one of Group 3:

[Group 3]

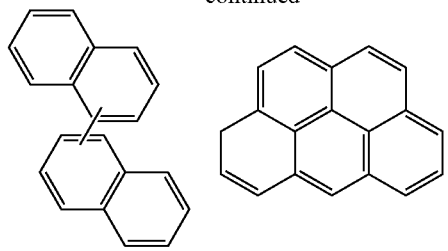

wherein, in Group 3,

M is a substituted or unsubstituted C1 to C5 alkylene group, O, S, $SO_2$, or C=O.

14. The organic layer composition as claimed in claim 9, wherein the polymer has a weight average molecular weight of about 1,000 to about 20,000.

15. The organic layer composition as claimed in claim 9, wherein the polymer is present in an amount of about 0.1 wt % to about 50 wt % based on the total amount of the organic layer composition.

16. A method of forming patterns, the method comprising:
providing a material layer on a substrate;
applying the organic layer composition as claimed in claim 9 on the material layer;
heat-treating the organic layer composition to provide a hardmask layer;
providing a silicon-containing thin layer on the hardmask layer;
providing a photoresist layer on the silicon-containing thin layer;

exposing and developing the photoresist layer to form a photoresist pattern;
selectively removing the silicon-containing thin layer and the hardmask layer using the photoresist pattern to expose a part of the material layer; and
etching an exposed part of the material layer.

17. The method as claimed in claim 16, wherein the organic layer composition is applied using a spin-on coating method.

18. The method as claimed in claim 16, further comprising providing a bottom antireflective coating (BARC) before providing the photoresist layer.

19. The organic layer composition as claimed in claim 9, wherein X is O, S, Te, or Se.

20. The organic layer composition as claimed in claim 9, wherein the polymer including a structural unit represented by Chemical Formula 1 includes a structural unit represented by one of the following Chemical Formulae 1a to 1e:

<Chemical Formula 1a>

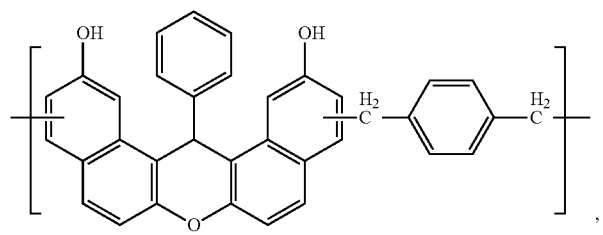

<Chemical Formula 1b>

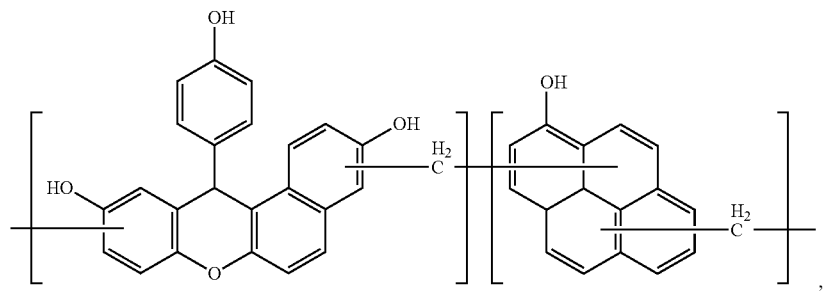

<Chemical Formula 1c>

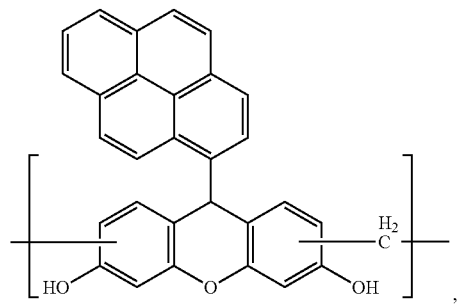

<Chemical Formula 1d>

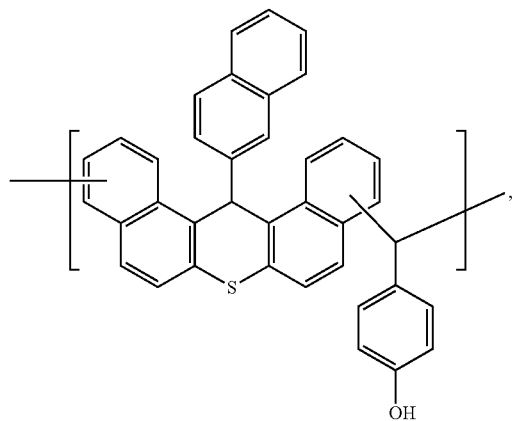

<Chemical Formula 1e>

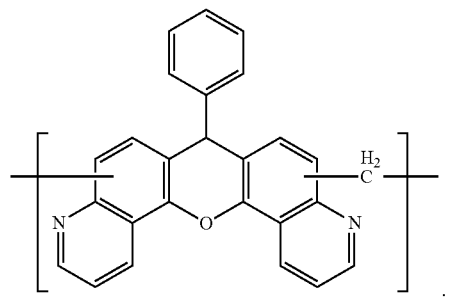

* * * * *